United States Patent
Goto et al.

(10) Patent No.: US 9,193,833 B2
(45) Date of Patent: Nov. 24, 2015

(54) PHOSPHOR-CONTAINING CURED SILICONE, PROCESS FOR PRODUCTION OF SAME, PHOSPHOR-CONTAINING SILICONE COMPOSITION, PRECURSOR OF THE COMPOSITION, SHEET-SHAPED MOLDINGS, LED PACKAGE, LIGHT-EMITTING DEVICE, AND PROCESS FOR PRODUCTION OF LED-MOUNTED SUBSTRATE

(75) Inventors: Kazuki Goto, Otsu (JP); Tetsuya Goto, Otsu (JP); Masuichi Eguchi, Otsu (JP); Takao Kitagawa, Otsu (JP); Kazunari Kawamoto, Otsu (JP); Yutaka Ishida, Otsu (JP); Hirofumi Tsuchiya, Otsu (JP); Takayoshi Akamatsu, Otsu (JP)

(73) Assignee: Toray Industries, Inc., Tokyo (JP)

( * ) Notice: Subject to any disclaimer, the term of this patent is extended or adjusted under 35 U.S.C. 154(b) by 450 days.

(21) Appl. No.: 13/578,388

(22) PCT Filed: Feb. 9, 2011

(86) PCT No.: PCT/JP2011/052718
§ 371 (c)(1),
(2), (4) Date: Jan. 29, 2013

(87) PCT Pub. No.: WO2011/102272
PCT Pub. Date: Aug. 25, 2011

(65) Prior Publication Data
US 2013/0125365 A1   May 23, 2013

(30) Foreign Application Priority Data

Feb. 19, 2010  (JP) .................................. 2010-034283
Mar. 30, 2010  (JP) .................................. 2010-077065

(51) Int. Cl.
| | | |
|---|---|---|
| *C08G 77/395* | (2006.01) |
| *B32B 38/00* | (2006.01) |
| *C09K 11/06* | (2006.01) |
| *H01L 33/50* | (2010.01) |

(52) U.S. Cl.
CPC ............... *C08G 77/395* (2013.01); *B32B 38/00* (2013.01); *C09K 11/06* (2013.01); *H01L 33/501* (2013.01); *Y10T 29/49826* (2015.01)

(58) Field of Classification Search
None
See application file for complete search history.

(56) References Cited

U.S. PATENT DOCUMENTS

| | | | |
|---|---|---|---|
| 6,066,861 A | 5/2000 | Hohn | |
| 6,495,649 B2 | 12/2002 | Harada | |
| 6,504,301 B1 | 1/2003 | Lowery | |
| 6,806,161 B2 | 10/2004 | Ko | |
| 7,045,956 B2* | 5/2006 | Braune et al. | 313/512 |
| 7,049,159 B2 | 5/2006 | Lowery | |
| 7,910,940 B2* | 3/2011 | Koike et al. | 257/98 |
| 8,541,103 B2 | 9/2013 | Fukui | |
| 2005/0253130 A1* | 11/2005 | Tsutsumi et al. | 257/13 |
| 2007/0041191 A1* | 2/2007 | Okada | 362/260 |
| 2007/0096131 A1 | 5/2007 | Chandra | |
| 2007/0126020 A1* | 6/2007 | Lin et al. | 257/100 |
| 2007/0176196 A1* | 8/2007 | Kim et al. | 257/99 |
| 2007/0298256 A1 | 12/2007 | Fukui | |
| 2008/0231170 A1* | 9/2008 | Masato et al. | 313/501 |
| 2008/0308828 A1 | 12/2008 | Kashiwagi | |
| 2009/0121180 A1* | 5/2009 | Tsubokawa et al. | 252/182.3 |
| 2009/0143505 A1 | 6/2009 | Samukawa | |
| 2009/0212257 A1 | 8/2009 | Sohn | |
| 2009/0298256 A1 | 12/2009 | Chen | |
| 2010/0295079 A1 | 11/2010 | Melman | |
| 2011/0045619 A1 | 2/2011 | Ling | |
| 2011/0063872 A1 | 3/2011 | Irie | |
| 2011/0186340 A1* | 8/2011 | Kuramoto et al. | 174/260 |
| 2013/0011617 A1* | 1/2013 | Tasaki et al. | 428/148 |
| 2013/0125365 A1 | 5/2013 | Goto | |

FOREIGN PATENT DOCUMENTS

| | | |
|---|---|---|
| EP | 1424363 | 6/2004 |
| EP | 1980591 | 10/2008 |
| EP | 2060537 A2 | 5/2009 |
| EP | 2189509 | 5/2010 |
| EP | 2537899 | 12/2012 |
| JP | 05152609 | 6/1993 |
| JP | 07099345 | 4/1995 |
| JP | 2000156528 | 6/2000 |
| JP | 2004343149 | 12/2004 |
| JP | 2005-42099 A | 2/2005 |

| | | | |
|---|---|---|---|
| JP | 2005-64233 A | 3/2005 |
| JP | 2006-321832 A | 11/2006 |
| JP | 2006-339581 A | 12/2006 |
| JP | 2008-19424 A | 1/2008 |
| JP | 2008-159713 A | 7/2008 |
| JP | 2009-173694 | 8/2008 |
| JP | 2009-120437 | 6/2009 |
| JP | 2009530437 | 8/2009 |
| JP | 2009235368 | 10/2009 |
| JP | 2010-044874 | 2/2010 |
| JP | 2010100743 | 5/2010 |
| JP | 2010123802 | 6/2010 |
| JP | 2010159411 | 7/2010 |
| JP | 2010285593 | 12/2010 |
| JP | 2011102004 | 5/2011 |
| JP | 2011184625 | 9/2011 |
| WO | 2010132160 | 11/2010 |

OTHER PUBLICATIONS

Machine-generated English language translation of JP-2006321832, translation generated Dec. 2014, 12 pages.*
International Search Report dated May 24, 2011, application No. PCT/JP2011/052718.
European Search Report dated Oct. 1, 2013, application No. 11 744 559.3.
European Search Report corresponding to application No. EP 11 84 9012, dated Mar. 28, 2014.
International Search Report dated Mar. 6, 2012, in Application No. PCT/JP2011/077802.
Entire patent prosecution history of U.S. Appl. No. 13/993,530, filed Jun. 12, 2013, entitled, "Phosphor Sheet, LED and Light Emitting Device Using the Same and Method for Manufacturing LED.".
Definition of contain downloaded from URL < http://www.merriam-webster.com/dictionary/contain > downlaoded on Dec. 1, 2014.
Office Action dated Dec. 11, 2014 for U.S. Appl. No. 13/993,530.
Singapore Search Report and Written Opinion dated Sep. 8, 2014, application No. 2013038070.
Office Action, dated May 20, 2015, of related U.S. Appl. No. 13/993,530, filed Jun. 12, 2013, entitled Phosphor Sheet, LED and Light Emitting Device Using the Same and Method for Manufacturing LED.

\* cited by examiner

Primary Examiner — Robert S Loewe

(74) *Attorney, Agent, or Firm* — RatnerPrestia

(57) ABSTRACT

A phosphor-containing cured silicone that is a cured silicone which has a structure represented by general formulae (1) and/or (2) and also has units selected from general formulae (3) and/or (4), the phosphor-containing cured silicone includes a phosphor and particles having units selected from general formulae (3) and/or (4):

[Chem. 1]

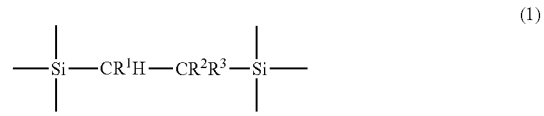

(1)

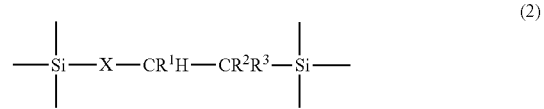

(2)

$$(R^4R^5SiO_{2/2}) \quad (3)$$

$$(R^6SiO_{3/2}) \quad (4)$$

wherein $R^1$ to $R^3$ are each a hydrogen atom, a methyl group, an ethyl group or a propyl group; X represents a methylene group, a dimethylene group or a trimethylene group, and may be the same or different; and $R^4$ to $R^6$ are each a substituted or unsubstituted monovalent hydrocarbon group, and may be the same or different.

An object of the present invention is to provide a cured silicone in which a phosphor is uniformly dispersed, the cured silicone is characterized in that a silicone material has good thermal resistance and lightfastness. In addition, an object of the present invention is to provide a process for production of an LED-mounted substrate by which a plurality of LED elements can be continuously mounted in a batch manner.

19 Claims, 8 Drawing Sheets

PHOSPHOR-CONTAINING CURED SILICONE, PROCESS FOR PRODUCTION OF SAME, PHOSPHOR-CONTAINING SILICONE COMPOSITION, PRECURSOR OF THE COMPOSITION, SHEET-SHAPED MOLDINGS, LED PACKAGE, LIGHT-EMITTING DEVICE, AND PROCESS FOR PRODUCTION OF LED-MOUNTED SUBSTRATE

TECHNICAL FIELD

The present invention relates to a cured silicone containing a phosphor, a process for production of the same, a phosphor-containing silicone composition, a precursor of the composition, a sheet, an LED package, a light-emitting device and a process for production of an LED-mounted substrate. More particularly, the present invention relates to a cured silicone having a phosphor uniformly dispersed therein, which is cured by hydrosilylation. Also, the present invention relates to a process for production of an LED-mounted substrate. More particularly, the present invention relates to a process for production of an LED-mounted substrate by which a plurality of LED elements can be continuously mounted in a batch manner.

BACKGROUND ART

A light emitting diode (LED) is characterized by low power consumption, long lifespan, aesthetics, etc., based on remarkable improvement of its luminous efficiency. Thus, its market is rapidly expanding for applications as a backlight for liquid crystal displays (LCDs) or a special lighting field. Also, due to an additional improvement of luminous efficiency, as it is characterized by the low environmental load as described above, a huge market is expected to be formed in a general lighting field in the future.

Meanwhile, since the emission spectrum of an LED is dependent on a semiconductor material forming an LED chip, a phosphor suitable for each chip has to be installed on the LED chip so as to achieve white light for LCD backlights or general lightings. More particularly, a method of installing a yellow phosphor on an LED chip emitting blue light, a method of installing red and green phosphors on a blue LED chip, and also a method of installing red, green and blue phosphors on an LED chip emitting ultraviolet rays have been proposed. However, a method of installing a yellow phosphor on a blue LED and a method of installing red and green phosphors on a blue phosphor are currently the most widely used from the viewpoints of the luminous efficiency and cost of the LED chip.

As one method of installing a phosphor on an LED chip, a method of forming a film on a chip using a polymer composition in which a phosphor is dispersed and then sealing the film with a silicone-based material having high transparency and good thermal resistance and lightfastness has been performed.

PRIOR ART DOCUMENTS

Patent Documents

For example, Patent Documents 1 and 2 discuss that silica particles are used so as to provide various kinds of performance such as higher hardness, higher cold/heat shock resistance and lower gas permeability even in silicone-based materials, and also discuss that a silicone-based material is used as a material in which a phosphor is dispersed so as to achieve high hardness and cold/heat shock resistance in addition to high transparency. Particularly, Patent Document 2 discloses that the silica particles having organopolysiloxane grafted into a surface thereof may be used to enable the light transmission and strength of a cured film to be compatible with each other and also prevent precipitation of a phosphor without expressing thixotropy.

Also, for example, Patent Document 3 proposes a technique for uniformly dispersing core-shell type fine silicone particles in a resin such as a silicone resin so as to inhibit precipitation of a phosphor.

Chromaticity of light emitted by an LED module is generated due to both of a deviation for the LED element (a wavelength shift and a brightness deviation of light emitted by the LED element) and a deviation for the phosphor (a deviation of an amount of the phosphor included in a sealing resin, and biasing of distribution of the phosphor in the sealing resin by the precipitation). For example, Patent Document 4 proposes a method of classifying LED modules according to the shifting of chromaticity and employing only the LED modules belonging to the same class as an LED light-emitting member so as to reduce the chromaticity deviation between the LED modules in the LED light-emitting member in the case of the LED light-emitting member having the plurality of LED modules mounted therein.

Patent Document 1: Japanese Patent Application Laid-open Publication No. 2009-173694
Patent Document 2: Japanese Patent Application Laid-open Publication No. 2009-120437
Patent Document 3: Japanese Patent Application Laid-open Publication No. 2006-339581
Patent Document 4: Japanese Patent Application Laid-open Publication No. 2010-44874

SUMMARY OF THE INVENTION

Problems to be Solved by the Invention

The techniques of Patent Documents 1 and 2 have problems in that a precipitation inhibition effect of the phosphor is insufficient, and the transparency is also insufficient.

The technique of Patent Document 3 has room for improving lightfastness and thermal resistance of a resin itself, and also has a problem to be solved, for example, requiring a complicated process to obtain core-shell type fine particles.

The technique of Patent Document 4 requires use of special particles whose production process is complicated, and a more convenient method using an inexpensive raw material has been required.

The present invention paid attention to these problems, and an object thereof is to provide a cured silicone in which a phosphor is uniformly dispersed, and a silicone composition capable of inhibiting precipitation of the phosphor and also preventing a large increase in thixotropy so as to obtain the cured product, which are characterized in that a silicone material has good thermal resistance and lightfastness.

Also, the conventional methods take a great deal of efforts and cost to produce an LED light-emitting member having a small chromaticity deviation since they require classification of the LED modules. In order to solve these problems, however, the present invention provides a method of conveniently manufacturing the LED light-emitting member having a small chromaticity deviation at a low cost.

Solutions to the Problems

That is, the phosphor-containing cured silicone according to the present invention is a cured silicone which has a structure represented by general formulae (1) and/or (2) and also has units selected from general formulae (3) and/or (4), the phosphor-containing cured silicone includes a phosphor and particles having units selected from general formulae (3) and/or (4).

[Chem. 1]

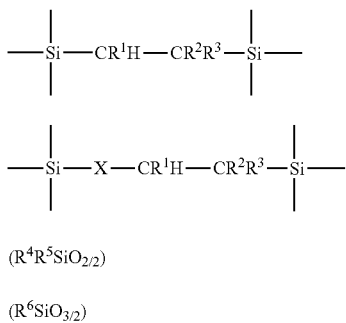

In Formula 1, $R^1$ to $R^3$ are each a hydrogen atom, a methyl group, an ethyl group or a propyl group, X represents a methylene group, a dimethylene group or a trimethylene group, and may be the same or different, and $R^4$ to $R^6$ are each a substituted or unsubstituted monovalent hydrocarbon group, and may be the same or different.

Also, the phosphor-containing silicone composition according to the present invention is a silicone composition for production of the phosphor-containing cured silicone. Here, the phosphor-containing silicone composition is a phosphor-containing silicone composition produced by mixing the following components (A) to (E):

Component (A): a compound having units selected from general formulae (5) and/or (6) and containing two or more alkenyl groups bound to a silicon atom and/or silicon atoms in one molecule;

Component (B): a compound having structures selected from general formulae (5) and/or (6) and containing two or more hydrogen atoms bound to a silicon atom and/or silicon atoms in one molecule;

Component (C): a hydrosilylation catalyst;

Component (D): a phosphor; and

Component (E): particles having units selected from general formulae (5) and/or (6).

[Chem. 2]

 (5)

 (6)

In Formula 2, $R^7$ to $R^9$ are each a substituted or unsubstituted monovalent hydrocarbon group, and may be the same or different.

The composition precursor according to the present invention is a silicone composition precursor for production of the phosphor-containing silicone composition. Here, the composition precursor is produced by mixing at least two of the components (A) to (E), and has one composition selected from the group consisting of the following compositions (i) to (vii):

(i) Components (A) and (B);
(ii) Components (A) and (C);
(iii) Components (A) and (E);
(iv) Components (A), (C) and (E);
(v) Components (B) and (E);

(vi) Components (A), (B) and (E); and
(vii) Components (C) and (E).

The process for production of a phosphor-containing cured silicone according to the present invention is one of the following production processes [1] and [2]. That is, the process for production of a phosphor-containing cured silicone is one of the process [1] of production of the phosphor-containing cured silicone by mixing the components (A) to (E), which includes producing a phosphor-containing silicone composition through any of the following operations (I) to (VIII), and curing the phosphor-containing silicone composition, and the process [2] of production of the phosphor-containing cured silicone by mixing the components (A) to (E), which includes producing a phosphor-containing silicone composition through any one of the following operations (IX) to (XI) and curing the phosphor-containing silicone composition:

(I) mixing a composition precursor including the components (A), (C) and (E) with the component (B);

(II) mixing a composition precursor including the components (A) and (C) with a composition precursor including the components (B) and (E);

(III) mixing a composition precursor including the components (A), (C) and (E) with a composition precursor including the components (B) and (E);

(IV) mixing a composition precursor including the components (A) and (C) with a composition precursor including the components (A) and (B) together with the component (B);

(V) mixing a composition precursor including the components (A) and (C) with the components (A), (B) and (E);

(VI) mixing a composition precursor including the component (B) with the component (D);

(VII) mixing a composition precursor including the component (C) with the component (D);

(VIII) mixing a composition precursor including the component (B) with a composition precursor including the component (C), followed by or at substantially the same time mixing with the component (D);

(IX) mixing the component (B) with the component (D);

(X) mixing the component (C) with the component (D); and (XI) mixing the component (B) with the component (C), followed by or at substantially the same time mixing with the component (D).

A sheet according to the present invention is a sheet in which the phosphor-containing cured silicone is molded on a substrate.

An LED package according to the present invention is an LED package including the phosphor-containing cured silicone.

A light-emitting device according to the present invention is a light-emitting device including the LED package.

A process for production of an LED-mounted substrate according to the present invention is a process for producing an LED-mounted substrate by mounting an LED element on a substrate having a circuit pattern formed therein. Here, the process includes bonding a plurality of LED elements to a substrate having a circuit pattern formed on at least one surface thereof, and then collectively sealing the plurality of LED elements with the phosphor-containing silicone composition.

Also, in the phosphor-containing cured silicone according to the present invention, the particles preferably have a homogenous structure.

The phosphor-containing cured silicone according to the present invention preferably has a ratio between the transmittance at 25° C. and the transmittance at 60° C. at a wavelength of 450 nm of 0.8 or more when the phosphor-containing cured silicone has a thickness of 75 μm.

The phosphor-containing cured silicone according to the present invention preferably has a ratio between the transmittance at 25° C. and the transmittance at 60° C. at a wavelength of 450 nm of 0.8 or more when a cured silicone obtained by curing the particles and the components (A) to (C) has a thickness of 75 μm.

In the phosphor-containing cured silicone according to the present invention, a difference between a refractive index $d_1$ of the particles and a refractive index $d_2$ of a region other than the particles and the phosphor is preferably less than 0.03.

In the phosphor-containing cured silicone according to the present invention, a difference between the refractive index $d_1$ of the particles and a refractive index $d_3$ of a cured product obtained by curing the components (A) to (C) is preferably less than 0.03.

In the phosphor-containing cured silicone according to the present invention, the particles preferably have an average particle diameter of 0.01 μm to 10 μm.

In the phosphor-containing cured silicone according to the present invention, the particles are preferably produced by hydrolyzing/condensing organosilane and/or a partial hydrolysate thereof.

In the phosphor-containing cured silicone according to the present invention, the particles preferably have a chain structure.

The phosphor-containing silicone composition according to the present invention preferably has a yield value of 0.01 Pa or more.

Effects of the Invention

According to the present invention, it is possible to manufacture a cured silicone in which a phosphor is uniformly dispersed by a convenient method using an inexpensive raw material, while keeping characteristics of a silicone material that it has good thermal resistance and lightfastness.

According to the present invention, it is possible to reduce a chromaticity deviation of an LED-mounted substrate. When such an LED-mounted substrate is used as an LED module, it is unnecessary to classify LED modules according to their optical characteristics, and it is possible to drastically reduce the production cost of an LED light-emitting member.

EMBODIMENTS OF THE INVENTION

Figure 1:
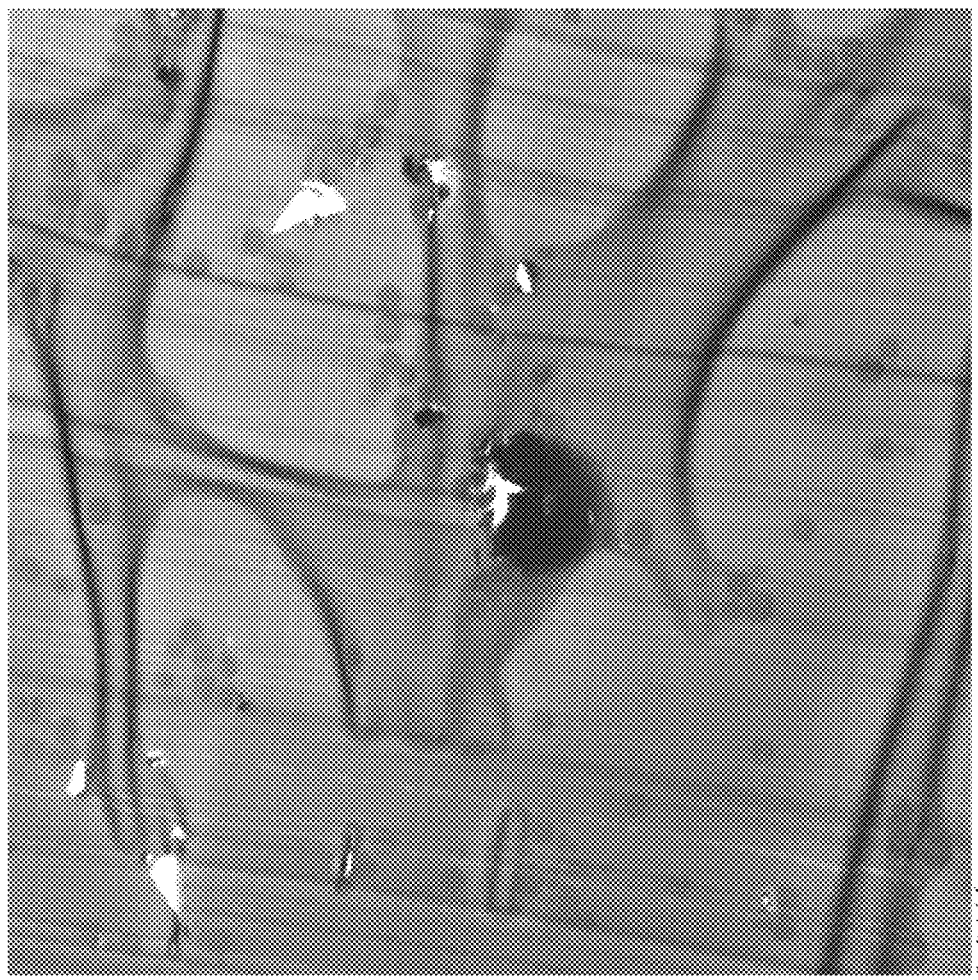
FIG. 1 is a TEM cross-sectional image showing how to form a structure of phosphor/silicone particles.

The inventors have found that the objects of the present invention are achieved using a cured silicone which has a structure represented by general formulae (1) and/or (2) and also has units selected from general formulae (3) and/or (4), and also includes a phosphor and particles having units selected from general formulae (3) and/or (4).

[Chem. 3]

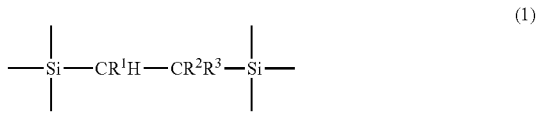

(1)

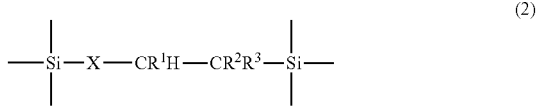

(2)

$(R^4R^5SiO_{2/2})$     (3)

$(R^6SiO_{3/2})$     (4)

In Formula 3, $R^1$ to $R^3$ are each a hydrogen atom, a methyl group, an ethyl group or a propyl group, X represents a methylene group, a dimethylene group or a trimethylene group, and may be the same or different, and $R^4$, $R^5$ and $R^6$ are each a substituted or unsubstituted monovalent hydrocarbon group, and may be the same or different.

Also, the cured silicone is obtained by curing a phosphor-containing silicone composition produced by mixing all the following components: component (A): a compound having units selected from general formulae (5) and/or (6) and containing two or more alkenyl groups bound to a silicon atom and/or silicon atoms in one molecule, component (B): a compound having units selected from general formulae (5) and/or (6) and containing two or more hydrogen atoms bound to a silicon atom and/or silicon atoms in one molecule, component (C): a hydrosilylation catalyst, component (D): a phosphor, and component (E): particles having units selected from general formulae (5) and/or (6).

[Chem. 4]

$(R^7R^8SiO_{2/2})$     (5)

$(R^9SiO_{3/2})$     (6)

In Formula 4, $R^7$ to $R^9$ are each a substituted or unsubstituted monovalent hydrocarbon group, and may be the same or different.

The structure represented by the general formulae (1) and/or (2) is a bond formed by hydrosilylation of a compound containing an alkenyl group bound to a silicon atom and a compound having a hydrogen atom bound to a silicon atom. Preferably, the structure is formed by reaction of component (A): a compound having units selected from general formulae (5) and/or (6) and containing two or more alkenyl groups bound to a silicon atom and/or silicon atoms in one molecule, with component (B): a compound having units selected from general formulae (5) and/or (6) and containing two or more hydrogen atoms bound to a silicon atom and/or silicon atoms in one molecule. A variety of structures may be formed by combination of the compound of component (A) and the compound of component (B). As described later, however, in the general formula (1), a bond in which $R^1$ to $R^3$ are all hydrogen, that is, a structure in which silicon atoms are bound to two methylene groups, is the most desirable from the viewpoints of the ease of obtainment of the compounds of components (A) and (B) and the reactivity.

The presence of such a bond may be analyzed through the structural analysis using solid NMR such as $^1$H-NMR or $^{13}$C-NMR, the copolymer compositions obtained by GC/MS measurement of a degradation product degraded and produced by tetraethoxysilane in the presence of alkali, the analysis of a crosslinking point, FT-IR, etc.

Also, in the general formulae (1) and (2), the silicon atom is bound to one or more oxygen atoms, and an alkyl group, an alkenyl group, a phenyl group or the like so that the silicon atom can function as a connection with an organopolysiloxane structure or an organopolysilsesquioxane structure.

The compound of component (A), that is, a compound having a structure selected from general formulae (5) and/or (6) and containing two or more alkenyl groups bound to a silicon atom and/or silicon atoms in one molecule, is preferably a silicone compound having two or more alkenyl groups. More particularly, examples of the compound of component (A) may include organopolysiloxane having an alkenyl group, organopolysilsesquioxane having an alkenyl group, an organopolysiloxane/polysilsesquioxane copolymer having an alkenyl group, organopolysiloxane having a resin structure, etc.

The alkenyl group is preferably an alkenyl group having 2 to 10 carbon atoms, and examples of the alkenyl group may include a vinyl group, an allyl group, a butenyl group, a hexenyl group, a decenyl group, etc. However, a vinyl group is preferred from the viewpoints of the reactivity with the compound of component (B) as will be described later, and the ease of production.

In the compound of component (A), the mean of the number of alkenyl groups per one silicon atom is in a range of 0.01 to 0.50, preferably in a range of 0.02 to 0.30. When the mean of the number of alkenyl groups is outside of this range, it is difficult to obtain desirable physical properties since it is difficult to carry out the curing between the compound of component (A) and the compound of component (B) as will be described later.

In Formula 4, $R^7$ to $R^9$ are each a substituted or unsubstituted monovalent hydrocarbon group, and may be the same or different. A substituted or unsubstituted monovalent hydrocarbon group having 1 to 10 carbon atoms is preferred. More particularly, examples of the hydrocarbon group may include an alkyl group such as a methyl group, an ethyl group, an n-propyl group, an n-butyl group, an n-pentyl group, an n-hexyl group, an n-heptyl group, an n-octyl group, an isopropyl group, an isobutyl group, a sec-butyl group, a t-butyl group, an isopentyl group, a neopentyl group, a t-pentyl group, an isohexyl group or a cyclohexyl group; an aryl group such as a phenyl group, a tolyl group or a naphthyl group; a haloalkyl group such as a 3-chloropropyl group, a 3,3,3-trifluoropropyl group or a 2-(nonafluorobutyl)ethyl group; and an aralkyl group such as an ethylbenzyl group or a 1-phenethyl group. Among these, an alkyl group and/or an aryl group are preferred, and a phenyl group and a methyl group are especially preferred.

A compound containing a methyl group as a main group is preferred for applications of LED package, especially applications requiring high thermal resistance and lightfastness. On the other hand, a compound containing a phenyl group as a main group is preferred for applications in which an extraction effect of light from an LED chip is of importance.

The fact that the compound of component (A) has a weight average molecular weight of 2,000 or more as calculated based on polystyrene using gel permeation chromatography is preferred from the viewpoint of the hardness of a cured product. The compound of component (A) generally has a solid phase or a viscous liquid phase at 25° C. Here, when the compound has a liquid phase, the compound generally has a viscosity of 10 Pa·s or more at 25° C.

The units constituting such a compound of component (A) may include a $ViMe_2SiO_{1/2}$ unit, a $ViMePhSiO_{1/2}$ unit, a $Me_3SiO$ unit, a $Me_2SiO_{2/2}$ unit, a $ViMeSiO_{2/2}$ unit, a $PhMeSiO_{2/2}$ unit, a $PhSiO_{3/2}$ unit, a $MeSiO_{3/2}$ unit, a $ViSiO_{3/2}$ unit, a $SiO_{4/2}$ unit, and the like. Also, in Formula 4, Me represents a methyl group, Vi represents a vinyl group, and Ph represents a phenyl group. The same meanings are applied hereinafter.

When $^{29}$Si-nuclear magnetic resonance analysis (hereinafter referred to as "NMR") is performed on the compound using tetramethylsilane (hereinafter referred to as "TMS") as the reference compound, a slight variation in peaks is observed according to the kind of substituents. However, each peak corresponding to a bifunctional structural unit of the general formula (5) is observed around −10 to −30 ppm, and each peak corresponding to a trifunctional structural unit of the general formula (6) is observed around −50 to −70 ppm. Therefore, it is possible to measure a ratio of constituent units of the compound by measuring $^{29}$Si-NMR and comparing peak areas of respective signals.

However, when it is impossible to discern the bifunctional structural unit of the general formula (5) through the $^{29}$Si-NMR measurement based on TMS, the results measured using $^1$H-NMR or $^{19}$F-NMR may be used in addition to the $^{29}$Si-NMR measurement results, as necessary, so as to discern a ratio of the structural unit.

Specific examples of the compound of component (A) may include compounds which are presented by the following unit formulae and average composition formulae, and contain at least an alkenyl group and a phenyl group. Also, as will be described later, the term "unit formula" refers to a unit constituting a polymer, and the term "average composition formula" refers to a formula illustrating what components the entire polymer composed of various units is composed of.

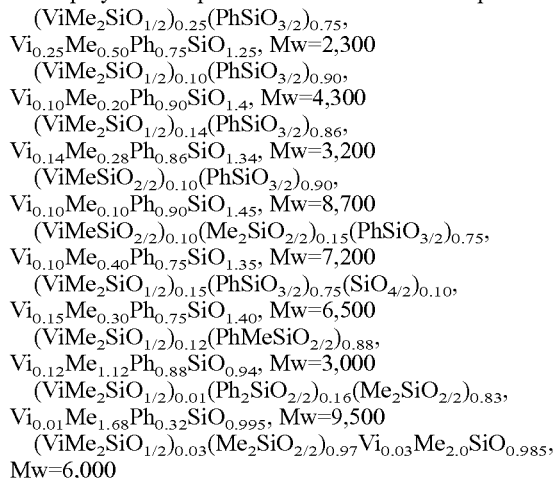

$(ViMe_2SiO_{1/2})_{0.25}(PhSiO_{3/2})_{0.75}$,
$Vi_{0.25}Me_{0.50}Ph_{0.75}SiO_{1.25}$, Mw=2,300
$(ViMe_2SiO_{1/2})_{0.10}(PhSiO_{3/2})_{0.90}$,
$Vi_{0.10}Me_{0.20}Ph_{0.90}SiO_{1.4}$, Mw=4,300
$(ViMe_2SiO_{1/2})_{0.14}(PhSiO_{3/2})_{0.86}$,
$Vi_{0.14}Me_{0.28}Ph_{0.86}SiO_{1.34}$, Mw=3,200
$(ViMeSiO_{2/2})_{0.10}(PhSiO_{3/2})_{0.90}$,
$Vi_{0.10}Me_{0.10}Ph_{0.90}SiO_{1.45}$, Mw=8,700
$(ViMeSiO_{2/2})_{0.10}(Me_2SiO_{2/2})_{0.15}(PhSiO_{3/2})_{0.75}$,
$Vi_{0.10}Me_{0.40}Ph_{0.75}SiO_{1.35}$, Mw=7,200
$(ViMe_2SiO_{1/2})_{0.15}(PhSiO_{3/2})_{0.75}(SiO_{4/2})_{0.10}$,
$Vi_{0.15}Me_{0.30}Ph_{0.75}SiO_{1.40}$, Mw=6,500
$(ViMe_2SiO_{1/2})_{0.12}(PhMeSiO_{2/2})_{0.88}$,
$Vi_{0.12}Me_{1.12}Ph_{0.88}SiO_{0.94}$, Mw=3,000
$(ViMe_2SiO_{1/2})_{0.01}(Ph_2SiO_{2/2})_{0.16}(Me_2SiO_{2/2})_{0.83}$,
$Vi_{0.01}Me_{1.68}Ph_{0.32}SiO_{0.995}$, Mw=9,500
$(ViMe_2SiO_{1/2})_{0.03}(Me_2SiO_{2/2})_{0.97}Vi_{0.03}Me_{2.0}SiO_{0.985}$,
Mw=6,000

Here, Mw represents a weight average molecular weight of a compound calculated based on polystyrene using gel permeation chromatography.

The compound of component (B), that is, a compound having a structure selected from general formulae (5) and/or (6) and containing two or more hydrogen atoms bound to a silicon atom and/or silicon atoms in one molecule, crosslinks the component (A) by addition reaction between the hydrogen atoms bound to the silicon atom and the alkenyl groups bound to the silicon atom in the compound of component (A), that is, hydrosilylation.

The component (B) is preferably a compound whose average composition formula is represented by the following general formula (7).

[Chem. 5]

$$H_c R^{10}_d SiO_{(4-c-d)/2} \quad (7)$$

In Formula 5, H represents a hydrogen atom, and $R^{10}$ is a substituted or unsubstituted monovalent hydrocarbon group having 1 to 10 carbon atoms other than the alkenyl group. Examples of $R^{10}$ may include the same groups as listed in $R^7$ to $R^9$.

For $R^{10}$, especially when the compound of component (B) has a low molecular weight, a problem regarding microphase separation when a composition is stored for a long time is caused. However, the surface roughness of a cured molding caused by the volatility of the component (B) under the curing conditions such as exposure to external environments may also be possibly caused. In this regard, it is desirable to have a phenyl group as $R^{10}$. Meanwhile, when the compound of component (B) has a sufficiently high weight average molecular weight, the compound of component (B) is compatible with the compound of component (A) and does not have a problem regarding the volatility even when the compound of component (B) does not have a phenyl group as $R^{10}$. On the other hand, the compound of component (B) preferably does not have a phenyl group for general lighting applications, that is, applications in which high thermal resistance and lightfastness for a cured product are of importance.

c represents the number of silicon atom-bound hydrogen atoms per one silicon atom in the compound of component (B), and is in a range of 0.35 to 1.0. d represents the mean of number of substituted or unsubstituted monovalent hydrocarbon groups having 1 to 10 carbon atoms other than the alkenyl groups per one silicon atom in the compound of component (B), and is in a range of 0.90 to 2.0. The compound of component (B) may be present in either a solid phase or a liquid phase at 25° C. However, the compound of component (B) is preferably present in a liquid phase so as to facilitate preparation of a composition according to the present invention. In this case, the compound of component (B) preferably has a viscosity at 25° C. of 100 Pa·s or less, and more preferably has a viscosity of 1 to 1,000 mPa·s. The compound of component (B) has a linear, cyclic, branched chain, reticular or three-dimensional molecular structure. Two or more compounds of component (B) may be used together.

More particularly, examples of such a compound of component (B) may include methyl hydrogen polysiloxane and methyl phenyl hydrogen polysiloxane, which are represented by the following unit formulae and average composition formulae.

$(HMe_2SiO_{1/2})_{0.65}(PhSiO_{3/2})_{0.35}$,
$H_{0.65}Me_{1.30}Ph_{0.35}SiO_{0.85}$
$(HMe_2SiO_{1/2})_{0.60}(PhSiO_{3/2})_{0.40}$, $H_{0.60}Me_{1.2}Ph_{0.40}SiO_{0.90}$
$(HMe_2SiO_{1/2})_{0.40}(PhSiO_{3/2})_{0.60}$,
$H_{0.40}Me_{0.80}Ph_{0.60}SiO_{1.10}$
$(HMe_2SiO_{1/2})_{0.35}(PhSiO_{3/2})_{0.65}$,
$H_{0.35}Me_{0.70}Ph_{0.65}SiO_{1.15}$
$(HMeSiO_{2/2})_{0.65}(PhSiO_{3/2})_{0.35}$,
$H_{0.65}Me_{0.65}Ph_{0.35}SiO_{1.175}$
$(HMeSiO_{2/2})_{0.50}(PhSiO_{3/2})_{0.50}$, $H_{0.5}Me_{0.50}Ph_{0.50}SiO_{1.25}$
$(HMeSiO_{2/2})_{0.35}(PhSiO_{3/2})_{0.65}$,
$H_{0.35}Me_{0.35}Ph_{0.65}SiO_{1.325}$
$(HMePhSiO_{1/2})_{0.60}(PhSiO_{3/2})_{0.40}$,
$H_{0.60}Me_{0.60}Ph_{1.00}SiO_{0.90}$
$(HMePhSiO_{1/2})_{0.40}(PhSiO_{3/2})_{0.60}$,
$H_{0.4}Me_{0.40}Ph_{1.00}SiO_{1.10}$
$(HMe_2SiO_{1/2})_{0.66}(Ph_2SiO_{2/2})_{0.33}$,
$H_{0.66}Me_{1.32}Ph_{0.66}SiO_{0.66}$
$(HMe_2SiO_{1/2})_{0.75}$ $(PhSiO_{3/2})_{0.25}$, $H_{0.75}Me_{1.50}Ph_{0.25}SiO_{0.75}$

The blending amount of the compound of component (B) is preferably in a range of 10 to 100 parts by weight, based on 100 parts by weight of the compound of component (A). Also, a hydrogen atom bound to a silicon atom in the compound of component (B) per 1 mole of an alkenyl group in the compound of component (A) is preferably in a range of 0.5 to 3 moles, and more preferably in a range of 0.7 to 1.5 moles from the viewpoints of curing properties and physical properties of a cured product.

The hydrosilylation catalyst of the component (C) is a catalyst for addition reaction between an alkenyl group in the compound of component (A) and a silicon atom-bound hydrogen atom in the compound of component (B), that is, hydrosilylation. More particularly, examples of the hydrosilylation catalyst may include a platinum-based catalyst such as fine platinum powder, or a powder of platinum black, chloroplatinic acid, tetrachloroplatinic acid, alcohol-modified chloroplatinic acid, an olefin complex of platinum, an alkenyl siloxane complex of platinum, a carbonyl complex of platinum, or a thermoplastic organic resin including such a platinum-based catalyst such as a methyl methacrylate resin, a polycarbonate resin, a polystyrene resin or a silicone resin; a rhodium-based catalyst represented by the following formula: [Rh (O₂CCH₃)₂]₂, Rh (O₂CCH₃)₃, Rh₂ (C₈H₁₅O₂)₄, Rh (C₅H₇O₂)₃Rh (C₅H₇O₂) (CO)₂, Rh (CO) [Ph₃P] (C₅H₇O₂), RhY₃[(R¹¹)₂S]₃, (R¹²₃P)₂Rh(CO)Y, (R¹²₃P)₂Rh (CO)H, Rh₂Y₂Z₄, Rh[O(CO)R¹¹]₃₋ₙ(OH)ₙ, or HₘRhₚ(En)ᵩClᵣ (wherein Y represents a hydrogen atom, a chlorine atom, a bromine atom, or an iodine atom, Z represents an alkyl group such as a methyl group or an ethyl group, CO, C₈H₁₄, or 0.5 C₈H₁₂, R¹¹ represents an alkyl group, a cycloalkyl group, or an aryl group, R¹² represents an alkyl group, an aryl group, an alkyloxy group, or an aryloxy group, En represents an olefin, n is 0 or 1, m is 0 or 1, p is 1 or 2, q is an integer ranging from 1 to 4, and r is 2, 3 or 4); and an iridium-based catalyst represented by the following formula: Ir(OOCCH₃)₃, Ir(C₅H₇O₂)₃, [Ir(D)(En)₂]₂, or [Ir(D)(Dien)]₂ (Wherein D represents a chlorine atom, a bromine atom, an iodine atom, or an alkoxy group, En represents an olefin, and Dien represents a cyclooctadiene). Among these, a platinum-based catalyst is preferred.

In particular, a platinum-alkenyl siloxane complex having a low chlorine concentration is preferred, and examples of the alkenyl siloxane may include 1,3-divinyl-1,1,3,3-tetramethyldisiloxane, 1,3,5,7-tetramethyl-1,3,5,7-tetravinylcyclotetrasiloxane, an alkenyl siloxane obtained by substituting some of methyl groups of these alkenyl siloxanes with a group such as an ethyl group or a phenyl group, and an alkenyl siloxane obtained by substituting vinyl groups of these alkenyl siloxanes with a group such as an allyl group or a hexenyl group. Particularly, since the platinum-alkenyl siloxane complex have good stability, the platinum-alkenyl siloxane complex is preferably 1,3-divinyl-1,1,3,3-tetramethyldisiloxane. Also, since the platinum-alkenyl siloxane complex has improved stability, an alkenyl siloxane such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, or 1,3,5,7-tetramethyl-1,3,5,7-tetravinylcyclotetrasiloxane, or an organosiloxane oligomer such as an dimethylsiloxane oligomer is preferably added to the complex. Especially, the alkenyl siloxane is preferably added to the complex.

Specific examples of such a hydrosilylation catalyst may include "SIP6829.0" (platinum carbonylvinylmethyl complex: a vinyl methyl cyclosiloxane solution having a platinum concentration of 3 to 3.5%), "SIP6830.0" (platinum·divinyltetramethyldisiloxane complex: a vinyl-terminated polydimethylsiloxane solution having a platinum concentration of 3 to 3.5%), "SIP6831.0" (platinum•divinyltetramethyldisiloxane complex xylene solution: the platinum concentration is 2.1 to 2.4%), "SIP6831.1" (platinum•divinyltetramethyldisiloxane complex xylene solution: the platinum concentration is 2.1 to 2.4%), "SIP6832.0" (platinum/cyclovinylmethylsiloxane complex: a cyclic methyl vinyl siloxane solution having a platinum concentration of 3 to 3.5%), and "SIP6833.0" (platinum-octyl aldehyde/octanol complex: an octanol solution having a platinum concentration of 2.0 to 2.5%), which are all commercially available from Gelest Inc. (USA), but the present invention is not limited thereto.

The hydrosilylation catalyst of the component (C) is generally used at a catalytic amount, and the amount is generally in a range of 1 to 500 ppm, preferably 2 to 100 ppm, based on the sum of the weight of the silicone composition according to the present invention, as calculated based on a metal.

Unlike the composition including the components (A), (B) and (C) as the main components which constitute the silicone composition, a condensable curable composition, which is cured by dehydration condensation of an alkoxysilane, acetoxysilane, or iminoxysilane compound as a main reaction, is known. However, such a composition is not employed for applications of the present invention because the composition has poor thermal resistance. This is because the dehydration condensation is often not completely performed during the curing, and curing is further performed due to a time-dependent change after the curing. Reaction of the silicone composition according to the present invention including the components (A), (B) and (C) as the main components is easily completed during the curing, and thus these problems are not easily caused.

The phosphor of the component (D) may absorb light emitted from a light-emitting element, perform wavelength conversion and emit light which is different in wavelength from the light of the light-emitting element. Therefore, when part of the light emitted from the light-emitting element and part of the light emitted from the phosphor are mixed, it is possible to manufacture a multichromatic LED including a white light-emitting element. More particularly, a single LED chip may be used to emit a white color by optically combining a fluorescent material, which emits a yellow light emission color due to the presence of light from the LED, with a blue LED.

The above-described phosphor includes various phosphors such as a phosphor emitting a green color, a phosphor emitting a blue color, a phosphor emitting a yellow color, a phosphor emitting a red color, and the like.

For example, the phosphor emitting a green color includes $SrAl_2O_4$:Eu, $Y_2SiO_5$:Ce, Tb, $MgAl_{11}O_{19}$:Ce, Tb, $Sr_7Al_{12}O_{25}$:Eu, (at least one of Mg, Ca, Sr, and Ba)$Ga_2S_4$:Eu, etc.

For example, the phosphor emitting a blue color includes $Sr_5(PO_4)_3Cl$:Eu, $(SrCaBa)_5(PO_4)_3Cl$:Eu, $(BaCa)_5(PO_4)_3Cl$:Eu, (at least one of Mg, Ca, Sr, and Ba)$_2B_5O_9Cl$:Eu, Mn, (at least one of Mg, Ca, Sr, and Ba)$(PO_4)_6Cl_2$:Eu, Mn, etc.

The phosphor emitting a yellow color includes an yttrium-aluminum oxide phosphor activated with at least cerium, an yttrium-gadolinium-aluminum oxide phosphor activated with at least cerium, an yttrium-aluminum-garnet oxide phosphor activated with at least cerium, and an yttrium-gallium-aluminum oxide phosphor activated with at least cerium (referred to as a YAG-based phosphor). More particularly, $Ln_3M_5O_{12}$:R (Ln is at least one selected from Y, Gd, and La, M includes either Al or Ca, and R is lanthanoid-based compound), $(Y1-xGax)_3(Al1-yGay)_5(O)_{12}$:R (R is at least one selected from Ce, Tb, Pr, Sm, Eu, Dy, and Ho, and $0<R<0.5$) may be used.

For example, the phosphor emitting a red color includes $Y_2O_2S$:Eu, $La_2O_2S$:Eu, $Y_2O_3$:Eu, $Gd_2O_2S$:Eu, etc.

Also, examples of the phosphor emitting light to correspond to the blue LED widely used at present include a YAG-based phosphor such as $Y_3(Al,Ga)_5O_{12}$: Ce, $(Y,Gd)_3Al_5O_{12}$: Ce, $Lu_3Al_5O_{12}$: Ce, or $Y_3Al_5O_{12}$:Ce, a TAG-based phosphor such as $Tb_3Al_5O_{12}$:Ce, a $(Ba,Sr)_2SiO_4$:Eu-based phosphor, a $Ca_3Sc_2Si_3O_{12}$:Ce-based phosphor, a silicate-based phosphor such as $(Sr,Ba,Mg)_2SiO_4$:Eu, a nitride-based phosphor such as $(Ca,Sr)_2Si_5N_8$:Eu, $(Ca,Sr)AlSiN_3$:Eu, or $CaSiAlN_3$:Eu, and an oxynitride-based phosphor such as Cax$(Si,Al)_{12}(O,N)$:Eu, and also includes a phosphor such as a (Ba, Sr, Ca) $Si_2O_2N_2$:Eu-based phosphor, a $Ca_8MgSi_4O_{16}Cl_2$:Eu-based phosphor, $SrAl_2O_4$:Eu, or $Sr_4Al_{14}O_{25}$:Eu.

Among these, the YAG-based phosphor, the TAG-based phosphor, and the silicate-based phosphor are preferably used from the viewpoints of the luminous efficiency and brightness.

According to the present invention, the particle size of the phosphor of the component (D) is represented by an average particle diameter, that is, the median diameter (D50), and is measured using a microtrack method (a method using an apparatus for measuring a microtrack laser diffraction particle size distribution commercially available from Nikkiso Co., Ltd.). That is, in the case of the volumetric reference particle size distribution measured using the method of measuring a laser diffraction/scattering particle size distribution, the particle diameter of 50% of the sum of undersize powder passing from a small particle sieve is calculated as a median diameter (D50). The phosphor having an average particle diameter, that is, a median diameter (D50), of 0.05 to 30 μm is preferably used, and the phosphor having an average particle diameter of 3 to 20 μm is more preferably used. When the average particle diameter, that is, the median diameter (D50), is within this preferred range, the dispersibility is good, and a change in emission spectrum and reduction of luminous efficiency is not easily caused. On the other hand, a deviation in light emission is not easily caused due to the difficulty of precipitation.

The phosphor of the component (D) may be included in an amount of 0.5 to 200 parts by mass, preferably 3 to 20 parts by mass, based on 100 parts by mass of the silicone composition other than the phosphor. When the phosphor of the component (D) is included in an amount of 0.5 parts by mass or more, it is possible to sufficiently perform conversion of light emitted from the light-emitting element. On the other hand, when the phosphor of the component (D) is included in an amount of 200 parts by mass or less, it is possible to maintain the transmittance of light.

The particles of the component (E) having a structure selected from general formulae (5) and (6) are so-called silicone particles that are obtained using a method of hydrolyzing an organosilane such as organotrialkoxysilane, organodialkoxysilane, organotriacetoxysilane, organodiacetoxysilane, organotrioximesilane, or organodioximesilane and condensing the hydrolyzed organosilane.

Examples of the organotrialkoxysilane may include methyltrimethoxysilane, methyltriethoxysilane, methyltri-n-propoxysilane, methyltri-i-propoxysilane, methyltri-n-butoxysilane, methyltri-i-butoxysilane, methyltri-s-butoxysilane, methyltri-t-butoxysilane, ethyltrimethoxysilane, n-propyltrimethoxysilane, i-propyltrimethoxysilane, n-butyltributoxysilane, i-butyltributoxysilane, s-butyltrimethoxysilane, t-butyltributoxysilane, N-β(aminoethyl)γ-aminopropyltrimethoxysilane, γ-glycidoxypropyltrimethoxysilane, vinyltrimethoxysilane, phenyltrimethoxysilane, etc.

Examples of the organodialkoxysilane may include dimethyldimethoxysilane, dimethyldiethoxysilane, methylethyldimethoxysilane, methylethyldiethoxysilane, diethyldiethoxysilane, diethyldimethoxysilane, 3-aminopropylmethyldiethoxysilane, N-(2-aminoethyl)-3-aminopropylmethyldimethoxysilane, N-(2-aminoethyl)-3-aminoisobutylmethyldimethoxysilane, N-ethylaminoisobutylmethyldiethoxysilane, (phenylaminomethyl)methyldimethoxysilane, vinylmethyldiethoxysilane, etc.

Examples of the organotriacetoxysilane may include methyltriacetoxysilane, ethyltriacetoxysilane, vinyltriacetoxysilane, etc.

Examples of the organodiacetoxysilane may include dimethyldiacetoxysilane, methylethyldiacetoxysilane, vinylmethyldiacetoxysilane, vinylethyldiacetoxysilane, etc.

Examples of the organotrioximesilane may include methyltrismethylethylketoximesilane and vinyltrismethylethylketoximesilane, and examples of the organodioximesilane include methylethylbismethylethylketoximesilane, etc.

More particularly, such particles may be obtained using a method disclosed in Japanese Patent Application Laid-open Publication No. 63-77940, a method disclosed in Japanese Patent Application Laid-open Publication No. 6-248081, a method disclosed in Japanese Patent Application Laid-open Publication No. 2003-342370, a method disclosed in Japanese Patent Application Laid-open Publication No. 4-88022, etc. Also, a method of preparing particles by adding an organosilane such as organotrialkoxysilane, organodialkoxysilane, organotriacetoxysilane, organodiacetoxysilane, organotrioximesilane, or organodioximesilane and/or a partial hydrolysate thereof to an aqueous alkali solution and hydrolyzing and condensing the organosilane and/or the partial hydrolysate, a method of preparing particles by adding an organosilane and/or a partial hydrolysate thereof to water or an acidic solution, hydrolyzing the organosilane and/or the partial hydrolysate to obtain a partial condensate and adding alkali to perform a condensation reaction, and a method of preparing particles by separating an organosilane and/or a hydrolysate thereof as a supernatant and alkali or a mixture solution of alkali and an organic solvent as a subnatant, and hydrolyzing/polycondensing the organosilane and/or the hydrolysate in the interface between the supernatant and the subnatant are known in the art. The particles used in the present invention may be obtained using any of the methods.

Among these, the silicone particles, which are obtained by a method of adding a polymeric dispersing agent to a reaction solution as disclosed in Japanese Patent Application Laid-open Publication No. 2003-342370, are preferably used when the organosilane and/or the partial hydrolysate is hydrolyzed/condensed to produce spherical organopolysilsesquioxane fine particles.

Also, in the production of the particles, silicone particles, which are produced by hydrolyzing/condensing an organosilane and/or a partial hydrolysate thereof, adding the organosilane and/or the partial hydrolysate to an aqueous acidic solution in the presence of a polymeric dispersing agent and a salt, which function as a protective colloid in a solvent, to obtain a hydrolysate, and adding alkali to perform a condensation reaction, may be used.

Any of a synthetic polymer and a natural polymer may be used as the polymeric dispersing agent as long as it is a water-soluble polymer, and functions as a protective colloid in a solvent. More particularly, examples of the polymeric dispersing agent may include polyvinylalcohol, polyvinylpyrrolidone, etc. Examples of a method of adding a polymeric dispersing agent may include a method of adding a polymeric dispersing agent to a starting reaction solution in advance, a method of adding a polymeric dispersing agent together with an organotrialkoxysilane and/or a partial hydrolysate thereof, and a method of hydrolyzing and partially condensing an organotrialkoxysilane and/or a partial hydrolysate thereof and adding a polymeric dispersing agent to the organotrialkoxysilane and/or the partial hydrolysate, and any of these methods may be selected. Here, an amount of the added polymeric dispersing agent is preferably in a range of $5 \times 10^{-7}$ to 0.05 parts by weight, based on 1 part by weight of the reaction solution. When the amount of the polymeric dispersing agent is within this range, cohesion between the particles does not easily take place.

As the components constituting the particles of the component (E), particles, which have units selected from general formulae (3) and/or (4) as described above, which are composed of a so-called addition-polymerizable component in addition to hydrolyzing/condensing an organosilane and/or a partial hydrolysate thereof, and which have a condensable shell formed on an addition-polymerizable core thereof, are also known in the art. However, when the addition-polymerizable silicone particles are produced, it is difficult to control the particle diameter, interaction between particles is very strong, and dispersion in a resin is not easily achieved. Formation of a condensable shell on an addition-polymerizable core does not cause any problem regarding interaction between the particles or dispersion. However, the use of a complicated process for production may cause problems such as poor curing of a silicone composition caused due to a residual addition polymerization or condensation polymerization catalyst or reaction inhibitor. In this regard, it is desirable to hydrolyze/condense the organosilane and/or the partial hydrolysate thereof having units selected from general formulae (3) and/or (4) according to the present invention.

Also, the particles having a homogenous structure as the structure of the particles are preferred from the viewpoints of the ease of production and the low probability of contaminating a material system which is easily caused during formation of a core-shell structure, as seen from the problems of the core-shell type particles.

According to the present invention, when such silicone particles are used as the component (E), it is unnecessary to perform special surface treatment on the particles, and it is possible to achieve dispersion stabilization by inhibiting precipitation of the phosphor in the silicone composition. The details of the mechanism remain to be solved, but are considered as follows. First, a silicone composition which does not include silicone particles but includes a phosphor has a good dispersion property, but shows Newtonian fluidity, and the phosphor is temporally precipitated due to its high specific gravity. Such a silicone composition does not have a yield value. Meanwhile, a silicone composition which does not include a phosphor but includes silicone particles expresses thixotropy and has a yield value. On the other hand, the silicone composition according to the present invention including a phosphor together with silicone particles has a high absolute viscosity, but has substantially the same yield value as the silicone composition which does not include the phosphor. Therefore, the interaction of the phosphor, the silicone particles and the silicone composition becomes stronger, but a structure formed through the interaction between the silicone particles is considered to be reduced. As a result, when the phosphor enters the structure between the silicone particles, that is, as the silicone particles form a structure while surrounding the phosphor, dispersion stabilization and precipitation inhibition of the phosphor is considered to be achieved.

Figure 2:
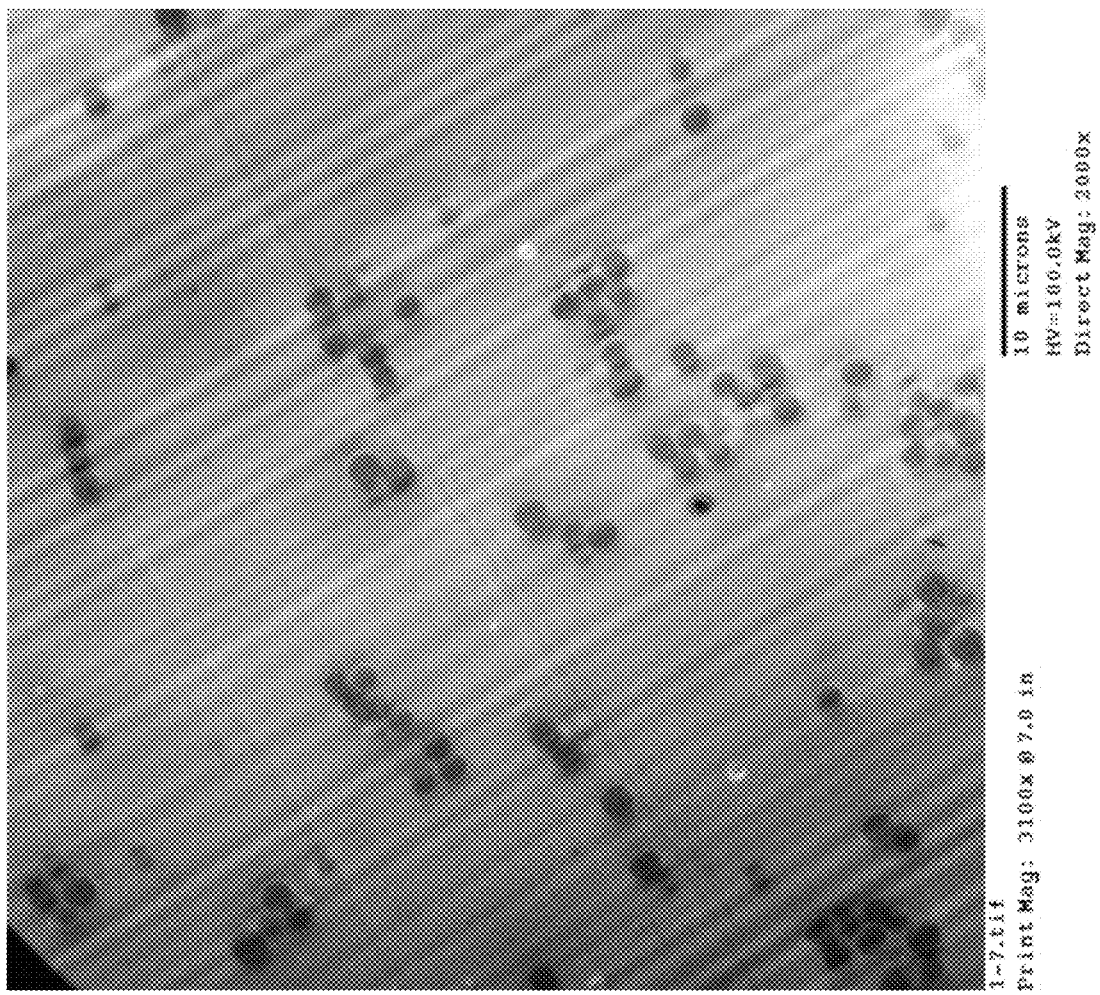
FIG. 2 is a TEM cross-sectional image showing how to form a structure of silicone particles.

FIG. 1 is a TEM cross-sectional image of a cured silicone according to the present invention (magnification: 2,000 times) obtained from each of the components (A), (B), (C), (D) and (E), and FIG. 2 is also a TEM cross-sectional image of the cured silicone (magnification: 2,000 times) obtained from each of the components (A), (B), (C) and (E). In FIG. 1, a region having a black center represents a phosphor of the component (D), and a white region in which a film is peeled off represents a region in which the phosphor of the component (D) is detached during production of a fragment sample (thickness of 200 nm) for TEM observation. In FIGS. 1 and 2, particle shapes gathered in places represent the particles of the component (E). During production of the fragment for TEM observation, a difference in film thickness is caused due to a difference in hardness of the cured silicone constituting the particles and a matrix, and thus the contrast is caused.

Figure 3:
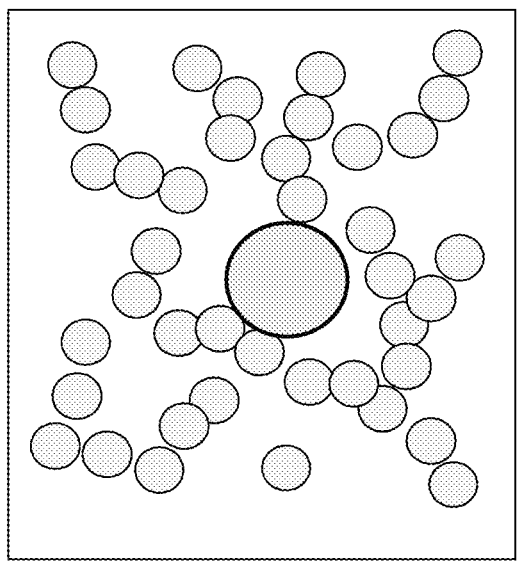
FIG. 3 is a schematic configuration diagram of the phosphor/silicone particles.

In both of FIGS. 1 and 2, patterns in which the particles of the component (E) are connected to form a chain structure are observed. Also, in FIG. 1, a pattern in which the chain structure is adjacent to the phosphor of the component (D) and a region in which the phosphor of the component (D) is detached is observed, which indicates that the above-described mechanism for dispersion stabilization of the phosphor is proved. FIG. 3 schematically shows a structure of the phosphor of the component (D) and the silicone particles of the component (E). In the chain structure having the particles of the component (E) formed in the cured silicone, the structure is formed so that the phosphor of the component (D) can be further introduced. The formation of the structure increases the viscosity and expresses the thixotropy. As a result, it is possible to confirm a mechanism indicating that the precipitation of the phosphor of the component (D) is inhibited.

As described above, for the silicone composition according to the present invention, the yield value and the absolute viscosity are important factors. Measurement of the yield value and the absolute viscosity is preferably performed after the respective components constituting the silicone composition are mixed, stirred and defoamed, and then left standing for 30 minutes. This is because an effect of an increase in temperature of the composition due to the stirring/defoaming, a crosslinking/curing effect of the silicone composition with elapse of time, and an effect of precipitation of the phosphor either are not easily caused.

A yield value of the silicone composition according to the present invention is preferably equal to or more than 0.01 Pa, and more preferably 0.05 Pa or more and further 0.1 Pa or more. When the yield value is set within this range, it is possible to stably maintain a dispersion state of the phosphor. On the other hand, the silicone composition preferably has a yield value of 0.4 Pa or less. When the yield value is set to 0.4 Pa or less, it is possible to properly maintain good process aptitude such as dispensing of the silicone composition.

Also, the absolute viscosity of the silicone composition is preferably equal to or less than 5.5 Pa·s. When the absolute viscosity is set to 5.5 Pa·s, it is possible to properly maintain good process aptitude such as moldability, coatability, and printability of the silicone composition.

Interaction between the silicone particles and the silicone composition and also interaction between the silicone particles and the silicone composition, and the phosphor may be controlled by adjusting the molecular weight of the compound of each of the components constituting the silicone composition, the percentage of amounts of the added compounds, an organo group such as a methyl group/phenyl group, the size of the silicone particles of the component (E), the amount of the added silicone particles, the ratio of the organo group such as the methyl group/phenyl group in the particles, etc. Also, it is possible to modify the shape and size of the structure formed by the silicone particles and phosphor in the silicone composition. As a result, it is possible to control the yield value and absolute viscosity of the silicone composition. To prevent an excess increase in yield value, for example, the silicone particles of the component (E) are preferably reduced in size to prevent an increase in surface area, and both of the silicone composition and the silicone particles are preferably composed so that an amount of a phenyl group showing $\pi$-$\pi$ interaction cannot increase to an excessive extent.

Preferably, the organo group included in the silicone particles of the component (E) is a methyl group or a phenyl group, and is preferably separately used according to the application. When light passing through the cured silicone is intended to be used without scattering, a refractive index difference between a refractive index $d_1$ of the silicone particles of the component (E) and a refractive index $d_2$ of a region other than the silicone particles and the phosphor is preferably small. On the other hand, when scattered light is intended to be used, the refractive index difference is preferably large. When a small refractive index difference is desirable, the refractive index difference between the refractive index $d_1$ of the silicone particles and the refractive index $d_2$ of the region other than the silicone particles and the phosphor is preferably equal to or less than 0.15, more preferably equal to or less than 0.03. When the refractive index is controlled within this range, reflection and scattering on the interface between the silicone particles and the silicone composition is reduced, and the high transparency and light transmittance are achieved.

Also, when light passing through the cured product is intended to be used without scattering similarly in the cured silicone, a difference between the refractive index $d_1$ of the silicone particles (E) and a refractive index $d_3$ of a cured product, which is obtained by curing the components (A), (B) and (C), is preferably small, more particularly, preferably equal to or less than 0.03; and further preferably equal to or less than 0.15.

Measurement of the refractive index is performed using an Abbe refractometer, a Pulfrich refractometer or an immersion refractometer, or using an immersion method or a minimum deflection angle method as a total reflection method. However, the Abbe refractometer is useful in measuring the refractive index of the silicone composition, and the immersion method is useful in measuring the refractive index of the silicone particles.

It is also possible to adjust the refractive index difference by changing the quantitative ratio of materials constituting the silicone particles. That is, for example, it is possible to obtain a low refractive index close to 1.4 by adjusting the mixing ratio of the raw materials, that is, methyltrialkoxysilane and phenyltrialkoxysilane, and increasing the constituent ratio of the methyl group. On the other hand, it is possible to obtain a relatively high refractive index by increasing the constituent ratio of the phenyl group.

According to the present invention, the size of the silicone particles of the component (E) is represented by an average particle diameter, that is, a median diameter (D50). Here, the average particle diameter is preferably in a range of 0.01 to 10 μm, and more preferably in a range of 0.05 to 3 μm. When the average particle diameter is too small, the difficulty in production may be caused, and a precipitation inhibitory effect of the phosphor is lowered. On the other hand, when the average particle diameter is too large, a negative effect may be exhibited on the transmittance of the cured product. Also, a precipitation inhibitory effect of the phosphor is lowered. Also, monodispersed and spherical particles are preferably used. According to the present invention, the average particle diameter, that is, the median diameter (D50), and particle size distribution of the silicone particles of the component (E) are measured using a microtrack method (a method using an apparatus for measuring a microtrack laser diffraction particle size distribution commercially available from Nikkiso Co., Ltd.). That is, in the case of the volumetric reference particle size distribution measured using the method of measuring a laser diffraction/scattering particle size distribution like the above-mentioned measurement of the average particle diameter of the phosphor, the particle diameter of 50% of the sum of undersize powder passing from a small particle sieve is calculated as the median diameter (D50).

The content of such silicone particles of the component (E) is preferably in a range of 1 to 50 parts by weight, and more preferably in a range of 5 to 20 parts by weight, based on 100 parts by weight of the sum of the components (A) to (C). When the silicone particles of the component (E) are included in an amount of 1 part by weight or more, a highly good dispersion stabilization effect of the phosphor is achieved. On the other hand, when the silicone particles of the component (E) are included in an amount of 50 parts by weight or less, the viscosity of the silicone composition is not excessively increased.

In the silicone composition according to the present invention, a hydrosilylation-retarding agent such as acetylene alcohol is preferably blended as the additional component to inhibit curing at room temperature, thereby lengthening the pot life. Also, fine particles such as fumed silica, glass powder, or quartz powder, an inorganic filler such as titanium oxide, zirconia oxide, barium titanate, or zinc oxide, a pigment, a flame retardant, a heat resistant, an antioxidant, a dispersing agent, a solvent, or a tackifier such as a silane coupling agent or a titanium coupling agent may be blended as necessary without adversely affecting the effects of the present invention.

In particular, a polydimethylsiloxane component having a low molecular weight, or silicone oil is preferably added from the viewpoint of the surface flatness of the cured silicone. Such a component is preferably added in an amount of 100 to 2,000 ppm, and more preferably a content of 500 to 1,000 ppm, based on the total composition.

Hereinafter, a phosphor-containing cured silicone, a process for production of the phosphor-containing cured silicone, a phosphor-containing silicone composition, a process for production of the phosphor-containing silicone composition, and a precursor of the composition according to the present invention will be described. Also, the phosphor-containing cured silicone, phosphor-containing silicone composition and the composition precursor may be produced using other known methods, and the present invention is not limited to production methods as will be described later.

Composition/composition precursor

The phosphor-containing cured silicone according to the present invention is obtained by mixing the components (A) to (E). However, when the components (A) to (C) are mixed, a curing reaction starts even at room temperature. Thus, a hydrosilylation-retarding agent such as an acetylene compound is preferably further blended to lengthen the pot life.

Also, as a method of storing each component, the respective components may be independently stored, or a mixture of several components may be stored from the viewpoint of reducing the work of preparing a composition. In this case, at least two of the components (A) to (E) are mixed from the viewpoint of avoiding mixing of the components (A) to (C), particularly, mixing of the component (B) and the component (C), and a silicone composition precursor having any one of the following compositions is preferably produced to be used: (i) the components (A) and (B), (ii) the components (A) and (C), (iii) the components (A) and (E), (iv) the components (A), (C) and (E), (v) the components (B) and (E), (vi) the components (A), (B) and (E), and (vii) the components (C) and (E). Also, these silicone composition precursors may include the component (D).

The silicone composition according to the present invention is obtained by mixing a combination of these composition precursors with the phosphor of the component (D). Finally, the phosphor-containing cured silicone according to the present invention may be obtained by curing the silicone composition prepared in this manner.

For example, a phosphor-containing silicone composition may be produced through any one of the operations: (I) mixing a composition precursor including the components (A), (C) and (E) with the component (B), (II) mixing a composition precursor including the components (A) and (C) with a composition precursor including the components (B) and (E), (III) mixing a composition precursor including the components (A), (C) and (E) with a composition precursor including the components (B) and (E), (IV) mixing a composition precursor including the components (A) and (C) with a composition precursor including the components (A) and (B) further with the component (E), (V) mixing a composition precursor including the components (A) and (C) with the components (A), (B) and (E), (VI) mixing a composition precursor including the component (B) with the component (D), (VII) mixing a composition precursor including the component (C) with the component (D), or (VIII) mixing a composition precursor including the component (B) with a composition precursor including the component (C), followed by or at substantially the same time mixing with the component (D). Curing the phosphor-containing silicone composition after the production may be one example of the process for production of a cured silicone. In this case, the phosphor of the component (D) may be included in any of the composition precursors or any of components used in the operations, or may be mixed during any of the operations.

In addition, the process of production of a phosphor-containing cured silicone by mixing the respective components (A) to (E) may include another example of a method of producing a phosphor-containing silicone composition through any one of the operations: (IX) mixing the component (B) with the component (D), (X) mixing the component (C) with the component (D), and (XI) mixing the component (B) with the component (C), followed by or at substantially the same time mixing with the component (D), and curing the phosphor-containing silicone composition after the production.

Mixing/Dispersion

Such various components may be combined to have a predetermined composition, and then homogeneously mixed/dispersed using a stirring/blending machine such as a homogenizer, a rotation/revolution-type stirrer, three rollers, a ball mill, a planetary ball mill, or a bead mill to produce a phosphor-containing silicone composition. The silicone composition is preferably defoamed under a vacuum or reduced pressure after the mixing/dispersion or during the mixing/dispersion.

The viscosity of the phosphor-containing silicone composition is properly adjusted by the ratio of the components, addition of a solvent or the like. However, the viscosity at 25° C. is preferably in a range of 100 to 10,000,000 mPa·s, and more preferably in a range of 300 to 500,000 mPa·s, as measured using a rotational viscometer.

Dispersion Stability

For the dispersion stability of the phosphor in the phosphor-containing silicone composition, a method of visually observing a pattern/rate of precipitation of the phosphor in the phosphor-containing silicone composition or measuring the pattern/rate of precipitation of the phosphor using an analyzer, or a method of measuring a difference and change in particle size distribution is used. More particularly, the dispersion stability of the phosphor may be evaluated using a method of directly optically measuring separation of a dispersed product through centrifugation using a dispersion stability analyzer "LUMiSizer" (commercially available from L.U.M. GmbH, Germany), or evaluated through particle size measurement using a particle gauge.

Curing

The phosphor-containing silicone composition obtained in this manner may be disposed on an LED chip using a method such as injection molding, compression molding, cast molding, transfer molding, extrusion molding, blow molding, calender molding, vacuum molding, foam molding, coating, dispensing, printing, or transferring, and cured to install a phosphor-dispersed product having a desired pattern on the LED chip. In the case of the curing by heating, the curing conditions are generally for 1 minute to 5 hours at 40 to 250° C., preferably for 5 minutes to 2 hours at 100° C. to 200° C.

Until the phosphor-containing silicone composition is produced and then cured, the retention time and heating time should be considered for the various processing processes, and it is necessary to stabilize dispersion of the phosphor and inhibit precipitation of the phosphor for about several tens of minutes to several days, generally for several hours to more than a dozen hours.

Sheet

First, a phosphor-dispersed product having a desired shape may be installed on an LED chip by applying the phosphor-containing silicone composition on a flexible base substrate having peelability, drying and curing or semi-curing the phosphor-containing silicone composition, followed by peeling and transferring the phosphor-containing silicone composition onto an LED chip, and further heating/curing the phosphor-containing silicone composition as necessary. In addition to a PET film, a PP film, a PPS film, a polyimide film, and an aramid film, paper, foil or a plate made of aluminum, and foil or a plate made of steel which have undergone coating treatment may be used as abase substrate. However, the PET film is preferred from the viewpoints of economical efficiency and handling, and the polyimide film is preferred from the viewpoint of thermal resistance when a high temperature is required for curing the silicone composition.

The thickness of the sheet is preferably in a range of 5 to 500 μm, more preferably in a range of 50 to 200 μm from the viewpoint of handling. Also, when there is a deviation in thickness, a difference in an amount of the phosphor on the LED chip is caused, thereby causing a deviation in an emission spectrum. Therefore, a deviation in thickness is preferably ±5%, more preferably ±3%.

Application of the phosphor-dispersed silicone composition on the base substrate may be performed using a method such as a reverse roller coater, a blade coater, a kiss coater, a slit die coater, screen printing, etc. However, the application is preferably performed using a slit die coater so as to achieve the uniformity in thickness of the sheet of the phosphor-dispersed silicone composition prepared as described above.

Transmittance

The cured silicone prepared as described above preferably has high transmittance since the cured silicone is used for optical applications such as sealing of LED chips. A preferable composition may be selected through comparison with the transmittance of the cured silicone that does not have the phosphor. More particularly, when the cured product (thickness of 150 μm) is obtained from the composition of the present invention that includes the respective components (A), (B), (C) and (E) but does not include the component (D), the cured product preferably has a transmittance at 400 nm of 70% or more, more preferably 80% or more. Also, a ratio between the transmittance at 25° C. and the transmittance at 60° C. at a wavelength of 450 nm when the thickness of the component (E), that is, the silicone particles, and the cured silicone which is obtained by curing the components (A) to (C) and does not include the component (D) is set to 75 μm is preferably equal to or more than 0.8, and further preferably equal to or more than 0.9.

Also, for the temperature dependency of the transmittance, the LED element is increased in temperature at the beginning of its use. However, since a deviation in performance is caused when the transmittance of a sealing material is different between at the beginning of use and after the elapse of time, the temperature dependency of the transmittance is preferably small. The temperature dependency of the transmittance may be examined, for example, by comparing a ratio between the transmittance at 25° C. of a cured product having a thickness of 75 μm and the transmittance at 60° C. at a wavelength of 450 nm. The ratio is preferably equal to or more than 0.8, and further preferably equal to or more than 0.9. The temperature dependency of the transmittance may be reduced by controlling the component ratio of a phenyl group and a methyl group in the particles, and the particle diameter.

Next, the process for production of an LED-mounted substrate will be described.

The process for production of an LED-mounted substrate according to the present invention is performed by mounting an LED element on a substrate having a circuit pattern formed therein, and is characterized in that the process includes bonding a plurality of LED elements to a substrate having a circuit pattern formed on at least one surface thereof and collectively sealing the plurality of LED elements with the phosphor-containing silicone composition.

Figure 8:
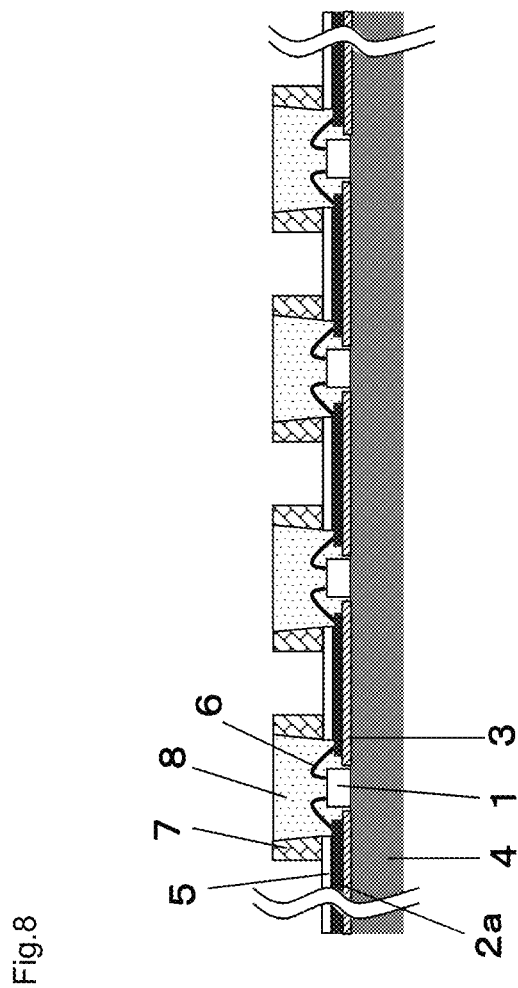
FIG. 8 is a cross-sectional view of one structure of an LED-mounted substrate produced according to the present invention.

According to the present invention, for example, the LED-mounted substrate as shown in FIG. 8 may be produced. The LED-mounted substrate of FIG. 8 includes LED elements 1 disposed in plural numbers, a circuit pattern 2 containing a predetermined repeating unit, an adhesive layer 3, and a heat dissipation layer 4. One example of the process for production of an LED-mounted substrate will be described, but the present invention is not limited thereto.

First, the adhesive layer 3 is laminated on metal foil that serves as a circuit, and the metal foil in a region in which an LED is installed is removed by punching or the like. Next, an adhesive layer side of the adhesive layer 3 having the metal foil attached thereto is laminated on the heat dissipation layer 4, and the adhesive layer 3 is thermally cured. After the curing, the circuit pattern 2 containing a predetermined repeating unit is formed on the metal foil, and a white solder resist 5 is applied on a region other than a region in which the LED element 1 is installed and a circuit region to be wire-bonded. Then, the LED element 1 is installed, and is connected to the circuit pattern 2 containing a predetermined repeating unit by means of a bonding wire 6. Thereafter, a reflection plate 7 is bonded and fixed in the circumference of the LED element 1, a phosphor-containing silicone composition 8 including a mixture of the following components (A) to (E) is injected into the reflection plate, and the LED element 1 is sealed.

Component (A): a compound having units selected from general formulae (1) and/or (2) and containing two or more alkenyl groups bound to a silicon atom and/or silicon atoms in one molecule;

Component (B): a compound having a structure selected from general formulae (1) and/or (2) and containing two or more hydrogen atoms bound to a silicon atom and/or silicon atoms in one molecule;

Component (C): a hydrosilylation catalyst;
Component (D): a phosphor; and
Component (E): particles having units selected from general formulae (1) and/or (2).

[Chem. 6]

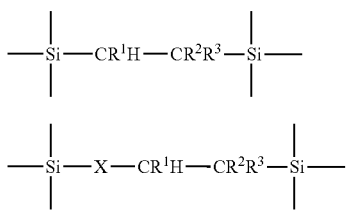

$R^1$ to $R^3$ are each a substituted or unsubstituted monovalent hydrocarbon group, and may be the same or different.

Here, the injection of the phosphor-containing silicone composition 8 according to the present invention may be collectively performed for a plurality of LED elements using a coating method or a printing method.

In general, a chromaticity deviation of the LED module is due to the deviation of the LED element itself and the deviation of a phosphor-containing sealing resin. Therefore, the optical characteristics are measured for conditions of the LED elements. Then, based on the optical characteristics, the LED elements are classified according to the emission wavelength and brightness, mounted on a substrate, and then optimally re-arranged so that a group of the LED elements can express predetermined optical characteristics (hereinafter, this is referred to as "binning").

In the case of conventional phosphor-containing silicone compositions, since a phosphor in the silicone composition is easily precipitated, and the silicone composition has low dispersion stability, it is difficult to inhibit deviation of the phosphor in each of the LED elements when the LED elements are collectively sealed with the silicone composition, and a chromaticity deviation in the LED-mounted substrate increases even when the binning is performed. As a result, even when the LED elements are collectively sealed, no merit of the collective sealing may be achieved since a subsequent process of individualizing the LED-mounted substrates to correspond to the LED elements and re-arranging the LED-mounted substrates is required.

On the other hand, the collective sealing can be performed on the phosphor-containing silicone composition according to the present invention since the phosphor has high dispersion stability. Examples of the collective sealing include a method of installing a reflection plate at a substrate on which LED elements are mounted in a plurality of rows and a plurality of columns by attaching the reflection plate in the circumference of each of the LED elements and potting a certain amount of a phosphor-containing silicone composition into the reflection plate, a method of transfer-molding the phosphor-containing silicone composition, and a method of screen-printing the phosphor-containing silicone composition.

The LED element 1 is an LED element using light emission from a PN junction in which a P-type semiconductor is joined to an N-type semiconductor, and a structure in which a P-type electrode and an N-type electrode are installed on upper and lower surfaces of the element and a structure in which both of the P-type and N-type electrodes are installed on one surface of the element have been proposed. In this case, both of the structures may be used for the process for production of an LED-mounted substrate according to the present invention. Even when the collective sealing is performed as described in the present invention, it is desirable to perform binning on the LED elements. This is because the deviation of the LED elements themselves may be inhibited, and the chromaticity deviation of the LED-mounted substrate may be further lowered.

The heat dissipation layer 4 serves to efficiently transfer heat generated from the LED elements to the outside. Here, either of an insulator and a conductor may be used as long as they have a heat dissipation function. For example, when a metal is used, examples of the heat dissipation layer 4 include copper, iron, aluminum, gold, silver, nickel, titanium, stainless steel, etc., and when an inorganic material is used, examples of the heat dissipation layer 4 include alumina, zirconia, aluminum nitride, carbon, etc. Also, a complex material obtained by combination of the metal and the inorganic material may be used. Also, a layer obtained by converting the inorganic material into a sintered compact, a layer obtained by kneading carbon or metal powder into an organic polymer so as to improve the thermal conductivity, and a layer obtained by coating a metal plate with an organic polymer may also be used. The shape of the heat dissipation layer 4 is not particularly limited, and a plate shape, a foil shape, and a fin shape may be used. Among these, a metal foil-shaped material is especially suitable for use since continuous production can be performed using a roll to roll method.

The circuit pattern 2 containing a predetermined repeating unit is made of metal foil processed into a wiring pattern shape. Copper foil, aluminum foil, nickel foil, stainless steel foil, copper alloy foil, and aluminum alloy foil may be used as the metal foil. A method of manufacturing metal foil may be rolling, electrolysis, etc. Any of the methods may be used. When there is no problem in a processing process of a TAB tape, the thickness of the circuit pattern 2 is not particularly limited, but it is preferably in a range of 3 to 105 μm. Also, it is possible to perform surface treatment on a surface layer of a metal layer. Examples of such surface treatment include treatment of plating a metal having excellent corrosion resistance, or fine-roughening treatment for improving the adhesion force with respect to an adhesive layer.

The adhesive layer 3 is generally provided in a semi-cured state, and may be cured or crosslinked by application of at least one energy selected from the group consisting of heating, pressurization, an electric field, a magnetic field, ultraviolet rays, radiation, and ultrasonic waves after lamination of the metal foil. The chemical structure of the adhesive layer 3 is not particularly limited. Among these, a thermosetting adhesive is preferred from the viewpoints of the thermal resistance, adhesive property and processing cost. Then, the adhesive composition constituting the adhesive layer preferably includes at least one thermoplastic resin and at least one thermosetting resin, and the kinds thereof are not particularly limited. The thermoplastic resin functions to enhance an adhesive property, relieve thermal stress and improve an insulation property through low water absorptiveness, and the thermosetting resin is necessary for realizing the balance of the physical properties, for example, improving the thermal resistance, chemical resistance, and adhesive film strength.

The white solder resist 5 is a white insulating resin aiming to efficiently reflect light from each of the LED elements and protect the circuit pattern 2 containing a predetermined repeating unit. A highly light-reflective material that efficiently reflects light is included in the thermosetting resin such as an epoxy resin. For example, an inorganic material such as titanium oxide particles or barium sulfate particles, or an organic material such as microporous acrylic resin fine particles or polycarbonate resin fine particles having numerous pores for light scattering is preferably used as the highly light-reflective material.

The reflection plate 7 is a plate functioning to unidirectionally reflect light emitted from the LED elements, and has a reverse polygonal frustum shape, a polyprism shape, a hemispherical shape, a parabolic curve shape, etc. An inner surface of the reflection plate 7 is formed of a mirror surface having high reflectivity or a mirror surface having diffusivity. A reflection plate formed by depositing a metal layer on one surface of a metal or resin-molded article is used herein.

EXAMPLES

Hereinafter, the present invention will be described in more detail with reference to examples. However, the present invention is not limited to the examples. Raw materials used in a phosphor-containing silicone composition in each of examples and comparative examples, and evaluation methods described in each of the examples and comparative examples are as follows.

Raw materials used in phosphor-containing silicone composition

Component (A): a compound having units selected from general formulae (5) and (6) and containing two or more alkenyl groups bound to a silicon atom and/or silicon atoms in one molecule.

Compound A1: "PMV-9925" commercially available from Gelest Inc. (vinyl-terminated polyphenylmethylsiloxane; unit formula: $(ViMe_2SiO_{1/2})_{0.12}(PhMeSiO_{2/2})_{0.88}$, average composition formula: $Vi_{0.12}Me_{1.12}Ph_{0.88}SiO_{0.94}$, Mw=3,000, refractive index: 1.53).

Compound A2: "PDV-1625" commercially available from Gelest Inc. (vinyl-terminated diphenyl siloxane-dimethylsiloxane copolymer; unit formula: $(ViMe_2SiO_{1/2})_{0.01}(Ph_2SiO_{2/2})_{0.16}(Me_2SiO_{2/2})_{0.83}$, average composition formula: $Vi_{0.01}Me_{1.68}Ph_{0.32}SiO_{0.995}$, Mw=9,500, refractive index: 1.47).

Compound A3: "DMS-V21" commercially available from Gelest Inc. (vinyl-terminated polydimethylsiloxane; unit formula: $(ViMe_2SiO_{1/2})_{0.03}(Me_2SiO_{2/2})_{0.97}$, average composition formula: $Vi_{0.03}Me_{2.0}SiO_{0.985}$, Mw=6,000, refractive index: 1.41).

Compound (B): a compound having units selected from general formulae (5) and (6) and containing two or more hydrogen atoms bound to a silicon atom and/or silicon atoms in one molecule.

Compound B1: "HPM-502" commercially available from Gelest Inc. (SiH group-terminated methylhydrosiloxane-phenylmethylsiloxane copolymer; unit formula: $(HMe_2SiO_{1/2})(HMeSiO_{2/2})(MePhSiO_{2/2})$, refractive index: 1.50).

Compound B2: "HDP-111" commercially available from Gelest Inc. (SiH group-terminated polyphenyl(dimethylhydrosiloxy)siloxane; unit formula: $(HMe_2SiO_{1/2})(PhSiO_{3/2})$, refractive index: 1.46).

Compound B3: "HMS-151" commercially available from Gelest Inc. (trimethylsiloxy-terminated methylhydrosiloxane-dimethylsiloxane copolymer; unit formula: $(Me_3SiO_{1/2})(HMeSiO_{2/2})(Me_2SiO_{2/2})$, refractive index: 1.40).

Compound (C): a hydrosilylation catalyst

Catalyst 1: "SIP6830.0" (platinum-divinyltetramethyldisiloxane complex; a vinyl-terminated polydimethylsiloxane solution having a platinum concentration of 3 to 3.5%).

Catalyst 2: "SIP6832.0" (platinum-cyclovinylmethylsiloxane complex; a cyclic methyl vinyl siloxane solution having a platinum concentration of 3 to 3.5%).

Silicone composition including components (A) to (C).

Composition 1: "OE6630" (a refractive index of 1.53) commercially available from Dow Corning Toray Co., Ltd. was used as the composition including the components (A) to (C). "OE6630" is used as a mixture of the composition including the components (A) and (C) and the composition including the components (A) and (B). A phenyl group, a methyl group, a vinyl group and an epoxy group are included at a ratio of 43/50/5/2 (molar ratio) as the functional groups in the former composition including the components (A) and (C), as measured using $^1$H-NMR analysis. According to the ICP-mass spectrometric results, the component (C) was included in an amount of 12 ppm in the former composition. On the other hand, a phenyl group, a methyl group, a vinyl group and hydrogen were included at a ratio of 42/40/9/9 (molar ratio) as the functional groups in the latter composition including the components (A) and (B), as measured using $^1$H-NMR analysis.

Composition 2: "OE6336" (a refractive index of 1.41) commercially available from Toray Dow Corning Co., Ltd. was used as the composition including the components (A) to (C).

Component (D): phosphor particles

Phosphor 1: "EY4254" commercially available from Internatix Corp. (Eu-doped, silicate-based phosphor; specific gravity: 4.71 g/cm$^3$, median diameter (D50): 15.5 μm).

Phosphor 2: "NYAG-02" commercially available from Internatix Corp. (Ce-doped YAG-based phosphor; specific gravity: 4.8 g/cm$^3$, median diameter (D50): 7 μm).

Component (E): particles having units selected from general formulae (5) and (6).

Particles 1: A 1 L 4-neck round bottom flask was equipped with a stirrer, a thermometer, a reflux pipe, and a dropping funnel, 600 g of an aqueous caustic soda solution of pH 12.5 (25° C.) was put into the flask, and warmed in an oil bath while stirring at 300 rpm. When the internal temperature reached 50° C., 60 g of methyltrimethoxysilane was dropped from the dropping funnel over 20 minutes. In this temperature condition, the stirring was further performed for 30 minutes, and 16.5 g of a 10% aqueous acetic acid solution was then added as a neutralizing agent, followed by mixing with stirring and filtration. To the particles formed on the filter, 300 mL of water (three times) and 200 mL of methanol (once) were added and the particles were filtered and washed. A cake on the filter was taken out, dried at 150° C. for 2 hours to obtain 20 g of white powder. The obtained particles were measured using an apparatus for measuring a particle size distribution (microtrack 9320HRA commercially available from Nikkiso Co., Ltd.). As a result, the obtained particles were monodispersed spherical fine particles having an average particle diameter, that is, a median diameter (D50), of 1.0 μm. The fine particles were measured for refractive index using an immersion method. As a result, a refractive index of 1.43 was obtained.

Particles 2: A 1 L 4-neck round bottom flask was equipped with a stirrer, a thermometer, a reflux pipe, and a dropping funnel, 600 g of an aqueous caustic soda solution of pH 12.5 (25° C.) was put into the flask, and warmed in an oil bath while stirring at 300 rpm. When the internal temperature reached 50° C., 60 g of a mixture of methyltrimethoxysilane and phenyltrimethoxysilane (77/23 mol %) was dropped from the dropping funnel over 20 minutes. In this temperature condition, the stirring was further performed for 30 minutes, and 16.5 g of a 10% aqueous acetic acid solution was then added as a neutralizing agent, followed by mixing with stirring and filtration. To the particles formed on the filter, 300 mL of water (three times) and 200 mL of methanol (once) were added and the particles were filtered and washed. A cake on the filter was taken out, and dried at 150° C. for 2 hours to obtain 14 g of monodispersed spherical fine particles having an average particle diameter, that is, a median diameter (D50) of 1.0 μm and a refractive index of 1.54.

Particles 3: A 1 L 4-neck round bottom flask was equipped with a stirrer, a thermometer, a reflux pipe, and a dropping funnel, 600 g of an aqueous caustic soda solution of pH 12.5 (25° C.) was put into the flask, and warmed in an oil bath while stirring at 300 rpm. When the internal temperature reached 50° C., 60 g of a mixture of methyltrimethoxysilane and phenyltrimethoxysilane (80/20 mol %) was dropped from the dropping funnel over 20 minutes. In this temperature condition, the stirring was further performed for 30 minutes, and 16.5 g of a 10% aqueous acetic acid solution was then added as a neutralizing agent, followed by mixing with stirring and filtration. To the particles formed on the filter, 300 mL of water (three times) and 200 mL of methanol (once) were added and the particles were filtered and washed. A cake on the filter was taken out, and dried at 150° C. for 2 hours to obtain 15 g of monodispersed spherical fine particles having an average particle diameter, that is, a median diameter (D50) of 1.0 μm and a refractive index of 1.55.

Particles 4: A 1 L 4-neck round bottom flask was equipped with a stirrer, a thermometer, a reflux pipe, and a dropping funnel, 600 g of an aqueous caustic soda solution of pH 12.5 (25° C.) was put into the flask, and warmed in an oil bath while stirring at 300 rpm. When the internal temperature reached 50° C., 60 g of phenyltrimethoxysilane was dropped from the dropping funnel over 20 minutes. In this temperature condition, the stirring was further performed for 30 minutes, and 16.5 g of a 10% aqueous acetic acid solution was then added as a neutralizing agent, followed by mixing with stirring and filtration. To the particles formed on the filter, 300 mL of water (four times) and 300 mL of methanol/water (1/1 volume ratio, twice) were added and the particles were filtered and washed. A cake on the filter was taken out, dried at 150° C. for 2 hours to obtain 16 g of white powder. The obtained particles were measured using an apparatus for measuring a particle size distribution (microtrack 9320HRA commercially available from Nikkiso Co., Ltd.). As a result, the obtained particles were monodispersed spherical fine particles having an average particle diameter, that is, a median diameter (D50), of 1.5 μm. The fine particles had a refractive index of 1.56.

Particles 5: A 1 L 4-neck round bottom flask was equipped with a stirrer, a thermometer, a reflux pipe, and a dropping funnel, 600 g of an aqueous caustic soda solution of pH 12.5 (25° C.) was put into the flask, and warmed in an oil bath while stirring at 200 rpm. When the internal temperature reached 50° C., 60 g of a mixture of methyltrimethoxysilane and phenyltrimethoxysilane (75/25 mol %) was dropped from the dropping funnel over 20 minutes. In this temperature condition, the stirring was further performed for 30 minutes, and 16.5 g of a 10% aqueous acetic acid solution was then added as a neutralizing agent, followed by mixing with stirring and filtration. To the particles formed on the filter, 300 mL of water (three times) and 200 mL of methanol (once) were added and the particles were filtered and washed. A cake on the filter was taken out, and dried at 150° C. for 2 hours to obtain 10 g of monodispersed spherical fine particles having an average particle diameter, that is, a median diameter (D50) of 5.0 μm and a refractive index of 1.52.

Particles 6: A 1 L 4-neck round bottom flask was equipped with a stirrer, a thermometer, a reflux pipe, and a dropping funnel, 600 g of an aqueous caustic soda solution of pH 12.5 (25° C.) was put into the flask, and warmed in an oil bath while stirring at 500 rpm. When the internal temperature reached 50° C., 60 g of a mixture of methyltrimethoxysilane and phenyltrimethoxysilane (75/25 mol %) was dropped from the dropping funnel over 30 minutes. In this temperature condition, the stirring was further performed for 30 minutes, and 16.5 g of a 10% aqueous acetic acid solution was then added as a neutralizing agent, followed by mixing with stirring and filtration. To the particles formed on the filter, 300 mL of water (three times) and 200 mL of methanol (once) were added and the particles were filtered and washed. A cake on the filter was taken out, and dried at 150° C. for 2 hours to obtain 10 g of monodispersed spherical fine particles having an average particle diameter, that is, a median diameter (D50) of 0.3 μm and a refractive index of 1.52.

Particles 7: 5 g of the particles 5 and 0.5 g of γ-glycidoxypropyltrimethoxysilane were put into a 50 mL vial, and uniformly mixed at room temperature for 1 hour while rotating. Then, a nitrogen gas was introduced, and the mixture was kept in an oven of 120° C. for 1 hour. Thereafter, the resulting mixture was kept at a reduced pressure and 120° C. for 3 hours in a vacuum dryer, and cooled to room temperature to obtain surface-treated particles 7. The particles 7 had a refractive index of 1.52, and an average particle diameter, that is, a median diameter (D50), of 5.0 μm.

Figure 4:
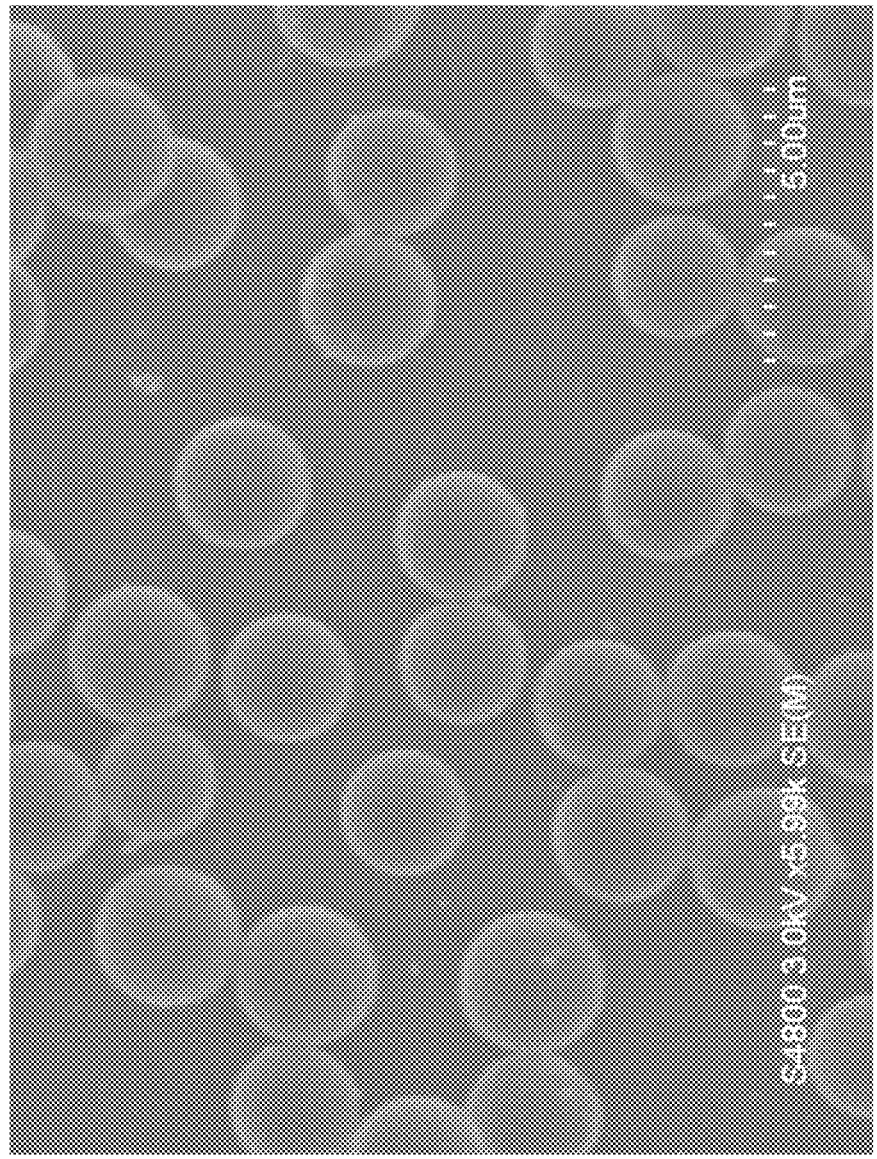
FIG. 4 is a SEM image of silicone particles having a homogenous structure.
Figure 5:
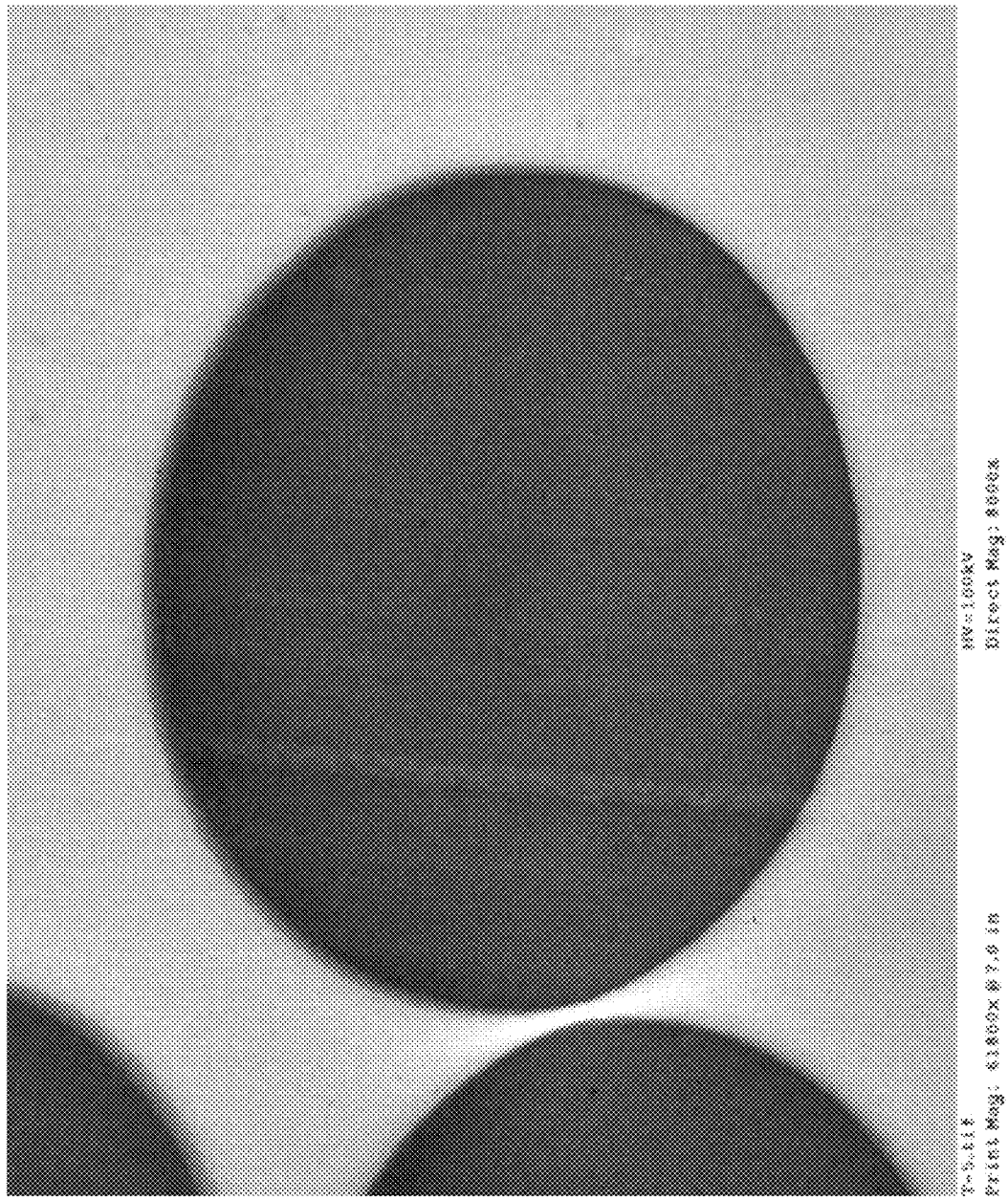
FIG. 5 is a TEM cross-sectional image of the silicone particles having a homogenous structure.

Particles 8: A 2 L 4-neck round bottom flask was equipped with a stirrer, a thermometer, a reflux pipe, and a dropping funnel, 2 L of 2.5% ammonia water was put into the flask, and warmed in an oil bath while stirring at 300 rpm. When the internal temperature reached 50° C., 200 g of methyltrimethoxysilane was dropped from the dropping funnel over 30 minutes. In this temperature condition, the stirring was further performed for 60 minutes, and approximately 5 g of acetic acid (special reagent grade) was then added, followed by mixing with stirring and filtration. To the particles formed on the filter, 600 mL of water (twice) and 200 mL of methanol (once) were added and the particles were filtered and washed. A cake on the filter was taken out, cracked, and lyophilized over 10 hours to obtain 80 g of white powder. The obtained particles were measured using an apparatus for measuring a particle size distribution (microtrack 9320HRA commercially available from Nikkiso Co., Ltd.). As a result, the obtained particles were monodispersed spherical fine particles having an average particle diameter, that is, a median diameter (D50), of 2.0 μm. The fine particles were measured for refractive index using an immersion method. As a result, a refractive index of 1.43 was obtained. The particles were observed using a SEM image (magnification: 6,000 times). As a result, it was confirmed that the particles had a well-ordered particle diameter (FIG. 4). Also, the structure of the particles was examined through a TEM cross-sectional image (magnification: 8,000 times). As a result, it was confirmed that the particles had a homogenous structure formed therein (FIG. 5).

Particles 9: "KMP-590" commercially available from Shin-Etsu Chemical Co., Ltd. was used as the silicone particles having a homogenous structure. Average particle diameter, that is, a median diameter: approximately 2 μm, refractive index: 1.43.

Figure 6:
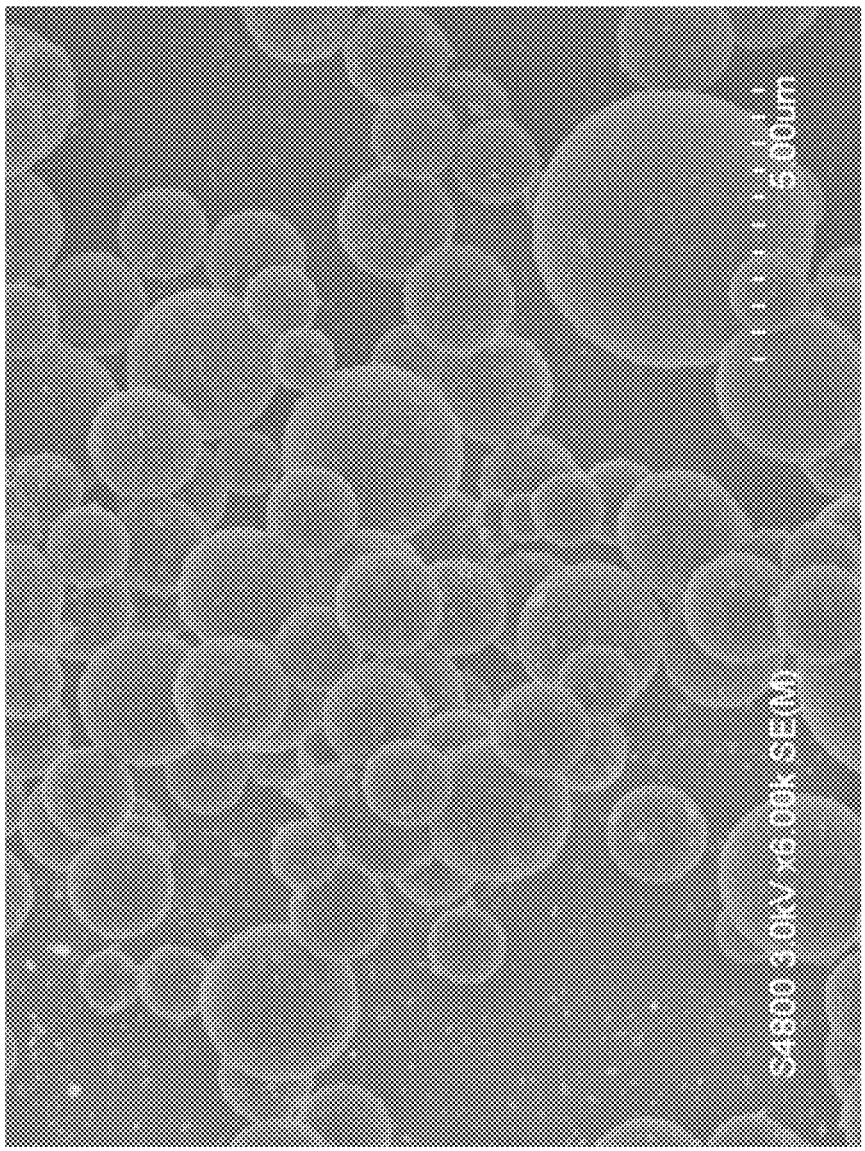
FIG. 6 is a SEM image of silicone particles having a core-shell structure.
Figure 7:
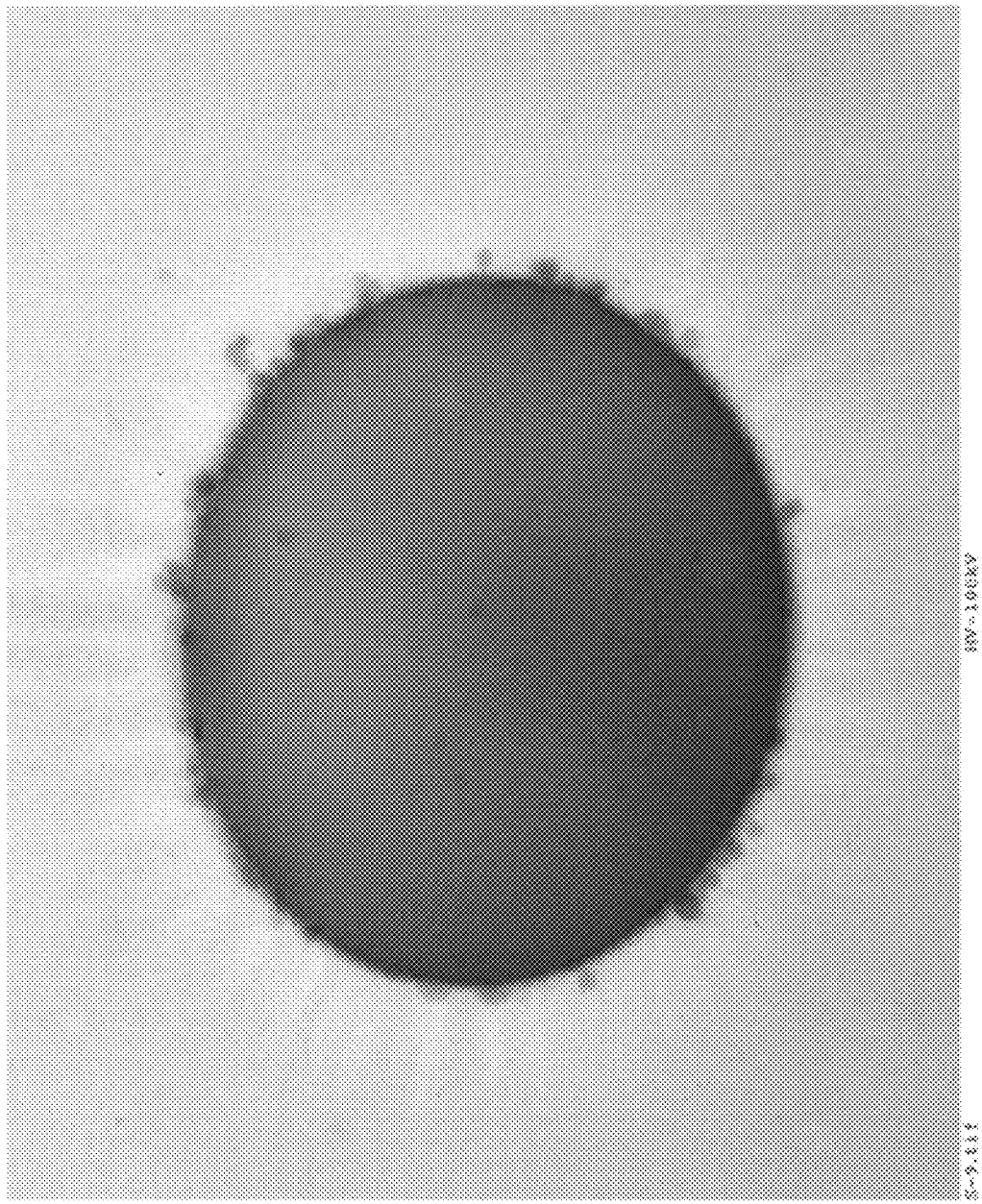
FIG. 7 is a TEM cross-sectional image of the silicone particles having a core-shell structure.

Particles 10: "KMP-605" commercially available from Shin-Etsu Chemical Co., Ltd. was used as the silicone particles having a core-shell structure. Average particle diameter: approximately 2 μm. The silicone particles were observed using a SEM image (magnification: 6,000 times). As a result, it was confirmed that there was a deviation in particle size distribution (FIG. 6). Also, the particles were observed through a TEM cross-sectional image (magnification: 8,000 times). As a result, it was confirmed that there were structures having a foreign substance shape on surfaces of the particles and a core-shell structure was confirmed (FIG. 7).

Particles 11: "KMP-600" commercially available from Shin-Etsu Chemical Co., Ltd. was used as the silicone particles having a core-shell structure. Average particle diameter, that is, median diameter (D50): approximately 5 μm.

Particles 12: (phenyl-methyl, 1.7 μm)

A 2 L 4-neck round bottom flask was equipped with a stirrer, a thermometer, a reflux pipe, and a dropping funnel, 2 L of 2.5% ammonia water was put into the flask, and warmed in an oil bath while stirring at 300 rpm. When the internal temperature reached 50° C., 200 g of a mixture of methyltrimethoxysilane and phenyltrimethoxysilane (75/25 mol %) was dropped from the dropping funnel over 30 minutes. In this temperature condition, the stirring was further performed for 60 minutes, and approximately 5 g of acetic acid (special reagent grade) was then added, followed by mixing with stirring and filtration. To the particles formed on the filter, 600 mL of water (twice) and 200 mL of methanol (once) were added and the particles were filtered and washed. A cake on the filter was taken out, cracked, and lyophilized over 10 hours to obtain 80 g of white powder. The obtained particles were measured using an apparatus for measuring a particle size distribution (microtrack 9320HRA commercially available from Nikkiso Co., Ltd.). As a result, the obtained particles were monodispersed spherical fine particles having an average particle diameter, that is, a median diameter (D50), of 1.7 μm. The fine particles were measured for refractive index using an immersion method. As a result, a refractive index of 1.53 was obtained. The particles were observed on a TEM cross-sectional image. As a result, it was confirmed that the particles had a homogenous structure formed therein.

Particles 13: (phenyl-methyl, precise refractive index matching: 1.7 μm)

A 2 L 4-neck round bottom flask was equipped with a stirrer, a thermometer, a reflux pipe, and a dropping funnel, 2 L of 2.5% ammonia water was put into the flask, and warmed in an oil bath while stirring at 300 rpm. When the internal temperature reached 50° C., 200 g of a mixture of methyltrimethoxysilane and phenyltrimethoxysilane (71/29 mol %) was dropped from the dropping funnel over 30 minutes. In this temperature condition, the stirring was further performed for 60 minutes, and approximately 5 g of acetic acid (special reagent grade) was then added, followed by mixing with stirring and filtration. To the particles formed on the filter, 600 mL of water (twice) and 200 mL of methanol (once) were added and the particles were filtered and washed. A cake on the filter was taken out, cracked, and lyophilized over 10 hours to obtain 80 g of white powder. The obtained particles were monodispersed spherical fine particles having an average particle diameter, that is, a median diameter (D50), of 1.7 μm. The fine particles were measured for refractive index using an immersion method. As a result, a refractive index of 1.56 was obtained. The particles were observed on a TEM cross-sectional image. As a result, it was confirmed that the particles had a homogenous structure formed therein.

Particles 14: (phenyl-methyl, precise refractive index matching: 0.5 μm)

A 2 L 4-neck round bottom flask was equipped with a stirrer, a thermometer, a reflux pipe, and a dropping funnel, 2 L of 2.5% ammonia water including 1 ppm of polyether-modified siloxane "BYK333" as a surfactant was put into the flask, and warmed in an oil bath while stirring at 300 rpm. When the internal temperature reached 50° C., 200 g of a mixture of methyltrimethoxysilane and phenyltrimethoxysilane (71/29 mol %) was dropped from the dropping funnel over 30 minutes. In this temperature condition, the stirring was further performed for 60 minutes, and approximately 5 g of acetic acid (special reagent grade) was then added, followed by mixing with stirring and filtration. To the particles formed on the filter, 600 mL of water (twice) and 200 mL of methanol (once) were added and the particles were filtered and washed. A cake on the filter was taken out, cracked, and lyophilized over 10 hours to obtain 60 g of white powder. The obtained particles were monodispersed spherical fine particles having an average particle diameter, that is, a median diameter (D50), of 0.5 μm. The fine particles were measured for refractive index using an immersion method. As a result, a refractive index of 1.56 was obtained. The particles were observed on a TEM cross-sectional image. As a result, it was confirmed that the particles had a homogenous structure formed therein.

Particles 15: (phenyl-methyl, precise refractive index matching: 0.01 μm)

A 2 L 4-neck round bottom flask was equipped with a stirrer, a thermometer, a reflux pipe, and a dropping funnel, 2 L of 2.5% ammonia water including 7 ppm of polyether-modified siloxane "BYK333" as a surfactant was put into the flask, and warmed in an oil bath while stirring at 300 rpm. When the internal temperature reached 50° C., 200 g of a mixture of methyltrimethoxysilane and phenyltrimethoxysilane (71/29 mol %) was dropped from the dropping funnel over 30 minutes. In this temperature condition, the stirring was further performed for 60 minutes, and approximately 5 g of acetic acid (special reagent grade) was then added, followed by mixing with stirring and filtration. To the particles formed on the filter, 600 mL of water (twice) and 200 mL of methanol (once) were added and the particles were filtered and washed. A cake on the filter was taken out, cracked, and lyophilized over 10 hours to obtain 40 g of white powder. The obtained particles were monodispersed spherical fine particles having an average particle diameter, that is, a median diameter (D50), of 0.1 μm. The fine particles were measured for refractive index using an immersion method. As a result, a refractive index of 1.56 was obtained. The particles were observed on a TEM cross-sectional image. As a result, it was confirmed that the particles had a homogenous structure formed therein.

Evaluation Method for Examples and Comparative Examples

Precipitation Inhibitory Effect 1 of Phosphor

In a 50 mL vial tube (diameter: 2 cm), 20 g of a phosphor-containing silicone composition in which the phosphor was dispersed was weighed and kept. Thereafter, a time (hr) required to visually cause a difference in concentration of the phosphor on top and bottom liquid portions of the composition was measured. This evaluation item is indicated as "Precipitation inhibition 1" in Tables 1 to 6.

Precipitation Inhibitory Effect 2 of Phosphor

A dispersion stability analyzer "LUMiSizer" (commercially available from L.U.M. GmbH, Germany) was used, and the light transmittance was measured 255 times at 2,000 rpm and a scan condition: intervals of 10 seconds. Then, the process of centrifugal precipitation of the phosphor in the silicone composition was monitored, and a change (%/hr) in transmittance per unit hour was measured. This evaluation item is indicated as "Precipitation inhibition 2" in Table 3.

Viscosity Behavior

The silicone composition prepared, stirred and defoamed as described above was left standing for 30 minutes. Thereafter, the viscosity behaviors (absolute viscosity (Pa·S) and yield value (Pa)) of a silicone composition including the phosphor were measured using type B viscometer "Model RVDVII+" commercially available from Brookfield.

Transmittance Measurement

For each of the silicone compositions listed in Tables 1 to 6, a silicone composition that does not include only the phosphor (D) among the components was separately prepared by the same method as described above. The silicone composition was applied onto a glass substrate to form a film, and cured by heating so that the film thickness after curing became 150 μm. Then, the transmittance (%) of a cured product at 400 nm was measured by "MultiSpec1500" commercially available from Shimadzu Corporation using a glass substrate as the reference.

For the compositions including the phosphor shown in Table 6, a cured product having a thickness of 75 μm was prepared. Then, the temperature dependency of the transmittance was examined by comparing a ratio between the transmittance at 25° C. and the transmittance at 60° C. at a wavelength of 450 nm.

Examples and Comparative Examples

[1] Preparation of Phosphor-Containing Silicone Composition and Cured Product

The silicone composition and the cured product were prepared in the following manner. Predetermined amounts of (A) an alkenyl group-containing compound, (B) a compound having a hydrogen atom bound to a silicon atom, (C) a hydrosilylation catalyst, (D) phosphor particles, (E) particles, and the additional components listed in Tables 1 to 3 were weighed in a polyethylene container having a volume of 300 mL, and the stirring/defoaming was performed at 1,000 rpm for 20 minutes using a planetary stirring/defoaming machine "Mazerustar KK-400" (commercially available from Kurabo Industries Ltd.). The resulting mixture was left standing for 1 hour, and cast on a glass substrate to a thickness of 2 mm. Thereafter, the mixture was subjected to heat treatment at 100° C. for 1 hour, and again at 160° C. for 1 hour in an oven to obtain a cured product.

Examples 1 to 7 and Comparative Example 1(Effect of Addition of Particles)

The results are shown in Tables 1 and 2. In Examples 1 to 7, a precipitation inhibitory effect of the phosphor as well as expression of the yield value were confirmed. Also, good transparency was achieved for the compositions that do not include the phosphor. On the other hand, it was revealed that the expression of the yield value was not observed and the phosphor precipitated within 1 hour in the case of Comparative Example 1.

Examples 1, 8 to 10 and Comparative Examples 2, 3, 6 and 7(Effect of Addition of Silicone Particles)

The results are shown in Tables 1 and 2. Also in Examples 8 to 10 in addition to Example 1, expression of the yield value and a good precipitation inhibitory effect of the phosphor were confirmed. In the case of Comparative Examples 2 and 6, silica particles "Aerosil" (registered trademark) were added instead of the silicone particles. As a result, a problem in processing properties was caused due to expression of the high yield value with an excessive increase in viscosity. Also, the precipitation inhibitory effect of the phosphor was lower than that of the present invention. In Comparative Examples 3 and 7, a dispersing agent was added instead of the silicone particles, but there was no expression of the yield value, and the precipitation inhibitory effect of the phosphor was hardly observed.

Examples 11 and 12 and Comparative Example 5(Effect of Addition of Particles)

The results are shown in Tables 1 and 2. In Examples 11 and 12, a good precipitation inhibitory effect of the phosphor as well as expression of the yield value were confirmed. Also, good transmittance was achieved for the compositions that do not include the phosphor. On the other hand, it was revealed that the expression of the yield value was not observed and the phosphor precipitated within 1 hour in the case of Comparative Example 5.

Examples 13 to 18 and Comparative Example 8(Effect of Addition Of Particles

The results are shown in Table 3. In Examples 13 to 18, a good precipitation inhibitory effect of the phosphor as well as expression of the yield value were confirmed. Also, good transmittance was achieved for the compositions that do not include the phosphor. On the other hand, it was revealed that the expression of the yield value was not observed and the phosphor precipitated within less than 1 hour in the case of Comparative Example 8. In addition, in the case of Examples 16 and 17 and Comparative Example 8, the precipitation inhibition effect 2 (a change in transmittance) was 95%/hr in Comparative Example 8, and 47%/hr and 58%/hr in Examples 16 and 17, respectively. From these facts, the data indicating the precipitation inhibitory effect of the phosphor by addition of the particles was obtained.

Comparative Example 4

A composition in which the phosphor (D) and the silicone particles (E) were added instead of the components (A) to (C) to the silicone composition including 100 parts by weight of polydimethylsiloxane (PDMS) having a Mw of 10,000 and a terminal hydroxyl group, 4 parts by weight of vinyl trismethylethylketoxime silane, and 0.02 parts by weight of dibutyl tin diacetate (DBTDA) was used. This composition was a condensation-polymerizable silicone composition that does not include any of the components (A), (B) and (C). However, it was revealed that the phosphor precipitated within 1 hour even when the silicone fine particles were added and the precipitation inhibitory effect of the phosphor was not observed.

Examples 19 to 25 and Comparative Examples 9 and 10(Effect Of Addition of Particles to Silicone Composition Precursor)

The results are shown in Table 4. In Examples 19, 22 and 25, the components (A), (C) and (E) were dispersed, mixed and left standing at room temperature for one week. Thereafter, the mixture, the component (B) and the phosphor (D)

were dispersed and mixed. In Comparative Examples 9 and 10, the components (A) and (C) were mixed, and then left standing at room temperature for one week. Thereafter, the mixture, the component (B) and the phosphor (D) were dispersed and mixed.

In Examples 20 and 23, dispersion mixtures obtained by dispersing and mixing the components (A) and (C) and dispersing and mixing the components (B) and (E) were left standing at room temperature for one week. Thereafter, the two dispersion mixtures and the phosphor (D) were dispersed and mixed.

In Examples 21 and 24, dispersion mixtures obtained by dispersing and mixing three components, that is, the components (A), (C) and (E), (provided that the component (E) was used in half of the other components) and dispersing and mixing the components (B) and (E) (provided that the component (E) was used in half of the other component) were left standing at room temperature for one week. Thereafter, the two dispersion mixtures and the phosphor (D) were dispersed and mixed.

In Examples 19 to 25, a good precipitation inhibitory effect of the phosphor as well as expression of the yield value were confirmed. Also, for the compositions that do not include the phosphor, a small difference between a refractive index of the particles and a refractive index of a region other than the particles and the phosphor and good transparency were achieved. On the other hand, it was revealed that the expression of the yield value was not observed and the phosphor precipitated within less than 1 hour in the case of Comparative Examples 9 and 10.

Reference Example

A composition that does not include the phosphor and is composed of the components (A) to (C) and (E) was used in the reference example. As shown in Table 2, the absolute viscosity was lower than that of Example 1, but the yield value was expressed. It was estimated that the silicone particles had a chain structure in the silicone composition.

Examples 26 to 30 (Effect of Particle Structure)

The results are shown in Table 5. In all of Examples 26 to 30, a good precipitation inhibitory effect of the phosphor as well as expression of the yield value were confirmed. In the compositions of Examples 26 and 27 which included the particles having a homogenous structure, there was no problem regarding the curing properties. On the other hand, in the compositions of Examples 28 and 29 which included the particles having a core-shell structure, the curing rather insufficiently proceeded under either a curing condition of 100° C. for 1 hour or 160° C. for 1 hour. In the case of Example 30 in which the content of the particles having a core-shell structure was small, the curing did not proceed out under the curing condition of 100° C. for 1 hour, but barely proceeded under the curing condition of 160° C. for 1 hour. However, the yield value was expressed, the viscosity slightly increased, and the precipitation inhibitory effect of the phosphor was slightly lower compared to those of the other examples. However, Examples 28 to 30 generally showed the effects intended by the present invention.

Examples 31 to 34 (Temperature Dependency)

The results are shown in Table 6. In all of Examples 31 to 34, although configurations of the particles and the particle diameters were different, a good precipitation inhibitory effect of the phosphor as well as expression of the yield value were confirmed.

In the composition of Example 31 including the particles 12, a slight decrease in transmittance was observed with an increase in temperature in the cured product including the phosphor, but the cured product had high transmittance at room temperature. On the other hand, in the composition of Example 32 which included the particles 13 having slightly different compositions, the transmittance at room temperature was slightly lower than that of Example 31, but the cured product including the phosphor had a small difference between the transmittance at room temperature and the transmittance at 60° C., and thus low temperature dependency. Also, the particles 14 and 15 were particles having a smaller particle diameter, which were prepared by adding a surfactant during synthesis of the particles. However, in the compositions of Examples 33 and 34 including these particles, the temperature dependency of transmittance was lowered more with improvement of the transmittance at room temperature.

[2] Preparation of Adhesive-Added Metal Foil

An ethanol/toluene mixed solvent (mixing ratio by weight: 1/4) was added to 100 parts by weight of a dimer acid polyamide resin ("Macromelt" 6900 commercially available from Henkel Japan Ltd.), 50 parts by weight of a resol-type phenolic resin (CKM1634 commercially available from Showa High Polymer Co., Ltd.), 50 parts by weight of an epoxy resin (jER828: a bisphenol A-type epoxy resin, epoxy equivalent 190, commercially available from Japan Epoxy Resin Co., Ltd.), 20 parts by weight of a novolac-type phenol resin (CKM2400 commercially available from Showa High Polymer Co., Ltd.), and 2 parts by weight of a curable catalyst (2-ethyl-4-methylimidazole commercially available from Tokyo Kasei Chemicals Ltd.), and mixed while stirring at 30° C. to prepare an adhesive solution having a solid content concentration of 25% by weight. A roll of a base film (SR: a polyethyleneterephthalate film having a silicone release agent attached thereto, thickness: 38 μm, commercially available from Otsuki Industrial Co., Ltd.) was set to an unwinding side using a reverse roll coater, and the adhesive solution was continuously applied to a dry thickness of 12 μm, and dried at 100° C. for 1 minute and at 160° C. for 4 minutes in a coater oven. Then, a protective film ("Torayfan" (registered trademark): a polypropylene film, thickness of 12 μm, commercially available from Toray Industries Inc.) was wound in a roll shape while being joined together in-line to manufacture an adhesive sheet.

Next, copper foil was roll-laminated at 120° C. while peeling the protective film from the adhesive sheet, and then wound in a roll shape to obtain copper foil having an adhesive attached thereto.

The copper foil having an adhesive attached thereto was punched using a press whose device hole was provided with a punching mold having a predetermined pattern. Next, an adhesive surface was laminated on a 1 mm-thick aluminum plate at 140° C. while peeling the base film. Thereafter, the copper foil was introduced into an air oven, and sequentially heat-treated at 80° C. for 3 hours, at 100° C. for 5 hours, and at 150° C. for 5 hours to obtain a three-layered structure of copper foil layer/adhesive layer/aluminum plate before a wiring process.

[3] Formation of Circuit Pattern

Subsequently, a photolithographic process was performed. First, a photoresist layer was formed on the copper foil layer of the three-layered structure before formation of the circuit pattern prepared as described above through lamination of a dry film resist. Then, the UV exposure was performed through a photomask, development was performed using an aqueous sodium carbonate solution and the like, and a photoresist pattern of the circuit pattern was formed on the LED element so that 2 rows and 40 columns could form one module. Then, the copper foil was etched using an acid such as an aqueous ferric chloride solution, and a photoresist was peeled using an aqueous sodium hydroxide solution to obtain a three-layered structure of wiring layer/adhesive layer/aluminum plate.

[4] LED Element Classification Process

A light emission test was performed on each of diced LED elements, and the LED elements were classified into a total of 25 scales by 5 scales of optical wavelength region and 5 scales of brightness.

[5] LED Element Mounting Process

White solder resist 18 (PSR-4000 commercially available from Taiyo Ink Mfg. Co., Ltd.) was applied on the wiring layer of the three-layered structure prepared in [3] except for a region in which the LED element was installed and a region to be wire-bonded, so that the dry thickness became 20 μm, and heated at 150° C. for 30 minutes to be cured.

Next, a thermosetting silver paste ("Dotite" (registered trademark) SA-2024 commercially available from Fujikura Kasei Co., Ltd.) was applied on an aluminum plate in contact with the device hole of the three-layered structure, and the LED elements classified in [4] were binned and mounted so that no brightness deviation would be caused in the 2 rows and the 40 columns, and the paste was heated at 120° C. for 1 hour and at 150° C. for 1 hour to be cured. Subsequently, two electrodes arranged on an upper surface of each of the LED elements were bonded with a circuit pattern through wire bonding using a ϕ30 μm gold wire.

Then, a reflection plate was bonded and fixed in the circumference of the LED element, sealed with each of the phosphor-containing silicone compositions shown in Table 7, and heated at 100° C. for 1 hour and again at 160° C. for 1 hour to be cured.

TABLE 1

| | | | Example 1 | Example 2 | Example 3 | Example 4 | Example 5 | Example 6 | Example 7 |
|---|---|---|---|---|---|---|---|---|---|
| Composition | A: vinyl silicone | Kind | Compound A1 | Compound A1 | Compound A1 | Compound A1 | Compound A1 | Compound A1 | Compound A1 |
| | | Amount (part by weight) | 70 | 70 | 70 | 70 | 70 | 70 | 70 |
| | B: SiH silicone | Kind | Compound B1 | Compound B1 | Compound B1 | Compound B1 | Compound B1 | Compound B1 | Compound B1 |
| | | Amount (part by weight) | 10 | 10 | 10 | 10 | 10 | 10 | 10 |
| | C: Catalyst | Kind | Catalyst 1 | Catalyst 1 | Catalyst 1 | Catalyst 1 | Catalyst 1 | Catalyst 1 | Catalyst 1 |
| | | Amount (part by weight) | 0.01 | 0.01 | 0.01 | 0.01 | 0.01 | 0.01 | 0.01 |
| | D: Phosphor | Kind | Phosphor 1 | Phosphor 1 | Phosphor 1 | Phosphor 1 | Phosphor 1 | Phosphor 1 | Phosphor 1 |
| | | Amount (part by weight) | 10 | 10 | 10 | 10 | 10 | 10 | 10 |
| | E: Particles | Kind | Particles 2 | Particles 2 | Particles 2 | Particles 5 | Particles 6 | Particles 1 | Particles 4 |
| | | Amount (part by weight) | 10 | 4 | 25 | 10 | 10 | 10 | 10 |
| | Refractive index of particles | | 1.54 | 1.54 | 1.54 | 1.52 | 1.52 | 1.43 | 1.56 |
| | Refractive index of region other than particles and phosphor | | 1.53 | 1.53 | 1.53 | 1.53 | 1.53 | 1.53 | 1.53 |
| | Difference in refractive index | | 0.01 | 0.01 | 0.01 | 0.01 | 0.01 | 0.1 | 0.03 |
| | Precipitation inhibition 1 | | 10 hr | 6 hr | 10 hr | 7 hr | 6 hr | 7 hr | 7 hr |
| | Absolute viscosity (Pa·S) | | 4.73 | 3.54 | 5.01 | 4.65 | 4.84 | 3.62 | 4.79 |
| | Yield value (Pa) | | 0.325 | 0.042 | 0.35 | 0.301 | 0.342 | 0.044 | 0.343 |
| | Transmittance | | 95% | 97% | 92% | 90% | 95% | 80% | 85% |

| | | | Example 8 | Example 9 | Example 10 | Example 11 | Example 12 |
|---|---|---|---|---|---|---|---|
| Composition | A: vinyl silicone | Kind | Compound A1 | Compound A2 | Compound A1 | Compound A3 | Compound A3 |
| | | Amount (part by weight) | 70 | 70 | 70 | 70 | 70 |
| | B: SiH silicone | Kind | Compound B1 | Compound B2 | Compound B1 | Compound B3 | Compound B3 |
| | | Amount (part by weight) | 10 | 10 | 10 | 10 | 10 |
| | C: Catalyst | Kind | Catalyst 1 | Catalyst 1 | Catalyst 1 | Catalyst 2 | Catalyst 2 |
| | | Amount (part by weight) | 0.01 | 0.01 | 0.01 | 0.01 | 0.01 |
| | D: Phosphor | Kind | Phosphor 2 | Phosphor 1 | Phosphor 1 | Phosphor 1 | Phosphor 1 |
| | | Amount (part by weight) | 10 | 10 | 10 | 10 | 10 |
| | E: Particles | Kind | Particles 2 | Particles 2 | Particles 7 | Particles 1 | Particles 4 |
| | | Amount (part by weight) | 10 | 10 | 10 | 10 | 10 |
| | Refractive index of particles | | 1.54 | 1.54 | 1.52 | 1.43 | 1.56 |
| | Refractive index of region other than | | 1.53 | 1.47 | 1.53 | 1.41 | 1.42 |

TABLE 1-continued

|  |  |  |  |  |  |
|---|---|---|---|---|---|
| particles and phosphor Difference in refractive index | 0.01 | 0.07 | 0.01 | 0.02 | 0.14 |
| Precipitation inhibition 1 | 9 hr | 7 hr | 4 hr | 10 hr | 10 hr |
| Absolute viscosity (Pa · S) | 4.74 | 4.68 | 2.94 | 1.79 | 1.91 |
| Yield value (Pa) | 0.338 | 0.301 | 0.012 | 0.041 | 0.12 |
| Transmittance | 95% | 80% | 80% | 97% | 75% |

TABLE 2

| | | | Comparative Example 1 | Comparative Example 2 | Comparative Example 3 | Comparative Example 4 | Comparative Example 5 |
|---|---|---|---|---|---|---|---|
| Composition | A: vinyl silicone | Kind | Compound A1 | Compound A1 | Compound A1 | PDMS: 100 oximesilane 4 DBTDA: 0.02 instead of components (A) to (C) (refractive index 1.45) | Compound A3 |
| | | Amount (part by weight) | 70 | 70 | 70 | | 70 |
| | B: SiH silicone | Kind | Compound B1 | Compound B1 | Compound B1 | | Compound B3 |
| | | Amount (part by weight) | 10 | 10 | 10 | | 10 |
| | C: Catalyst | Kind | Catalyst 1 | Catalyst 1 | Catalyst 1 | | Catalyst 2 |
| | | Amount (part by weight) | 0.01 | 0.01 | 0.01 | | 0.01 |
| | D: Phosphor | Kind | Phosphor 1 | Phosphor 1 | Phosphor 1 | Phosphor 1 | Phosphor 1 |
| | | Amount (part by weight) | 10 | 10 | 10 | 10 | 10 |
| | E: Particles | Kind | None | None | None | Particles 1 | None |
| | | Amount (part by weight) | None | None | None | 10 | None |
| | Others | Kind | None | Aerosil #200 | Dispersing agent "Nopcosperse" 092 | None | None |
| | | Amount (part by weight) | None | 10 | 5 | None | None |
| Refractive index of particles | | | — | — | — | 1.43 | — |
| Refractive index of region other than particles and phosphor | | | 1.53 | 1.53 | 1.53 | 1.45 | 1.41 |
| Difference in refractive index | | | — | — | — | 0.02 | — |
| Precipitation inhibition 1 | | | <1 hr | 2 hr | 1 hr | 1 hr | <1 hr |
| Absolute viscosity (Pa · S) | | | 2.75 | 5.98 | 2.8 | 6.01 | 1.68 |
| Yield value (Pa) | | | None | 0.64 | None | None | None |
| Transmittance | | | 97% | 85% | 95% | 90% | 98% |

| | | | Comparative Example 6 | Comparative Example 7 | Reference Example |
|---|---|---|---|---|---|
| Composition | A: vinyl silicone | Kind | Compound A3 | Compound A3 | Compound A1 |
| | | Amount (part by weight) | 70 | 70 | 70 |
| | B: SiH silicone | Kind | Compound B3 | Compound B3 | Compound B1 |
| | | Amount (part by weight) | 10 | 10 | 10 |
| | C: Catalyst | Kind | Catalyst 2 | Catalyst 3 | Catalyst 1 |
| | | Amount (part by weight) | 0.01 | 0.01 | 0.01 |
| | D: Phosphor | Kind | Phosphor 1 | Phosphor 1 | None |
| | | Amount (part by weight) | 10 | 10 | None |
| | E: Particles | Kind | None | None | Particles 2 |
| | | Amount (part by weight) | None | None | 10 |
| | Others | Kind | Aerosil #200 | Dispersing agent "Nopcosperse" 092 | None |
| | | Amount (part by weight) | 10 | 5 | None |
| Refractive index of particles | | | — | — | 1.54 |

TABLE 2-continued

|  |  |  |  |  |
|---|---|---|---|---|
|  | Refractive index of region other than particles and phosphor | 1.41 | 1.42 | 1.53 |
|  | Difference in refractive index | — | — | 0.01 |
|  | Precipitation inhibition 1 | 2 hr | 1 hr | — |
|  | Absolute viscosity (Pa · S) | 5.64 | 1.73 | 2.7 |
|  | Yield value (Pa) | 0.47 | None | 0.32 |
|  | Transmittance | 85% | 95% | 95% |

PDMS: polydimethylsiloxane, oximesilane: vinyltrismethylketoximesilane, DBTDA: dibutyl tin diacetate

TABLE 3

|  |  |  | Example 13 | Example 14 | Example 15 | Example 16 | Example 17 | Example 18 | Comparative Example 8 |
|---|---|---|---|---|---|---|---|---|---|
| Composition | A: vinyl silicone | Kind<br>Amount (part by weight) | Composition 1 | Composition 1 | Composition 1 | Composition 2 | Composition 2 | Composition 2 | Composition 2 |
|  | B: SiH silicone | Kind<br>Amount (part by weight) |  |  |  |  |  |  |  |
|  | C: Catalyst | Kind<br>Amount (part by weight) |  |  |  |  |  |  |  |
|  | D: Phosphor | Kind<br>Amount (part by weight) | Phosphor 1<br>10 | Phosphor 1<br>10 | Phosphor 1<br>10 | Phosphor 1<br>10 | Phosphor 1<br>10 | Phosphor 1<br>10 | Phosphor 1<br>10 |
|  | E: Particles | Kind<br>Amount (part by weight) | Particles 2<br>10 | Particles 2<br>5 | Particles 3<br>10 | Particles 1<br>10 | Particles 1<br>5 | Particles 1<br>15 | None<br>None |
|  | Refractive index of particles |  | 1.54 | 1.54 | 1.55 | 1.43 | 1.43 | 1.43 | — |
|  | Refractive index of region other than particles and phosphor |  | 1.54 | 1.54 | 1.54 | 1.41 | 1.41 | 1.41 | 1.41 |
|  | Difference in refractive index |  | 0 | 0 | 0.01 | 0.02 | 0.02 | 0.02 | — |
|  | Precipitation inhibition 1 |  | 10 hr | 10 hr | 10 hr | 10 hr | 7 hr | 7 hr | <1 hr |
|  | Precipitation inhibition 2 |  | — | — | — | Change in transmittance 47%/hr | Change in transmittance 58%/h | — | Change in transmittance 95%/hr |
|  | Absolute viscosity (Pa · S) |  | 4.74 | 3.55 | 4.7 | 2.01 | 1.84 | 2.24 | 1.66 |
|  | Yield value (Pa) |  | 0.335 | 0.046 | 0.325 | 0.0336 | 0.0086 | 0.098 | None |
|  | Transmittance |  | 97% | 97% | 98% | 97% | 97% | 97% | 98% |

TABLE 4

|  |  |  | Example 19 | Example 20 | Example 21 | Example 22 | Example 23 |
|---|---|---|---|---|---|---|---|
| Composition | A: vinyl silicone | Kind | Compound A1 | Compound A1 | Compound A1 | Compound A3 | Compound A3 |
|  |  | Amount (part by weight) | 70 | 70 | 70 | 70 | 70 |
|  | B: SiH silicone | Kind | Compound B1 | Compound B1 | Compound B1 | Compound B3 | Compound B3 |
|  |  | Amount (part by weight) | 10 | 10 | 10 | 10 | 10 |
|  | C: Catalyst | Kind | Catalyst 1 | Catalyst 1 | Catalyst 1 | Catalyst 2 | Catalyst 2 |
|  |  | Amount (part by weight) | 0.01 | 0.01 | 0.01 | 0.01 | 0.01 |
|  | D: Phosphor | Kind | Phosphor 1 | Phosphor 1 | Phosphor 1 | Phosphor 1 | Phosphor 1 |
|  |  | Amount (part by weight) | 10 | 10 | 10 | 10 | 10 |
|  | E: Particles | Kind | Particles 2 | Particles 2 | Particles 2 | Particles 1 | Particles 1 |
|  |  | Amount (part by weight) | 10 | 10 | 10 | 10 | 10 |
| Dispersion/Mixing |  |  | Mix components A, C and E, leave mixture | Mix components A and C, mix components B | Mix components A, C and E (half amount), mix components | Mix components A, C and E, leave mixture | Mix components A and C, mix components B |

TABLE 4-continued

| | | | for one week and mix whole components | and E, leave mixture for one week and mix whole components | B and E (half amount), leave mixture for one week and mix whole components | for one week and mix whole components | and E, leave mixture for one week and mix whole components |
|---|---|---|---|---|---|---|---|
| | Refractive index of particles | | 1.54 | 1.54 | 1.54 | 1.43 | 1.43 |
| | Refractive index of region other than particles and phosphor | | 1.53 | 1.53 | 1.53 | 1.41 | 1.41 |
| | Difference in refractive index | | 0.01 | 0.01 | 0.01 | 0.02 | 0.02 |
| | Precipitation inhibition 1 | | 10 hr | 10 hr | 10 hr | 10 hr | 10 hr |
| | Absolute viscosity (Pa · S) | | 4.74 | 4.73 | 4.74 | 1.8 | 1.79 |
| | Yield value (Pa) | | 0.326 | 0.325 | 0.326 | 0.042 | 0.041 |
| | Transmittance | | 95% | 95% | 95% | 97% | 97% |

| | | | Example 24 | Example 25 | Comparative Example 9 | Comparative Example 10 |
|---|---|---|---|---|---|---|
| Composition | A: vinyl silicone | Kind | Compound A3 | Compound A3 | Compound A1 | Compound A3 |
| | | Amount (part by weight) | 70 | 70 | 70 | 70 |
| | B: SiH silicone | Kind | Compound B3 | Compound B3 | Compound B1 | Compound B3 |
| | | Amount (part by weight) | 10 | 10 | 10 | 10 |
| | C: Catalyst | Kind | Catalyst 2 | Catalyst 2 | Catalyst 1 | Catalyst 2 |
| | | Amount (part by weight) | 0.01 | 0.01 | 0.01 | 0.01 |
| | D: Phosphor | Kind | Phosphor 1 | Phosphor 1 | Phosphor 1 | Phosphor 1 |
| | | Amount (part by weight) | 10 | 10 | 10 | 10 |
| | E: Particles | Kind | Particles 1 | Particles 1 | (None) | (None) |
| | | Amount (part by weight) | 10 | 2 | (None) | (None) |
| Dispersion/Mixing | | | Mix components A, C and E (half amount), mix components B and E (half amount), leave mixture for one week and mix whole components | Mix components A, C and E, leave mixture for one week and mix whole components | Mix components A and C, leave mixture for one week and mix whole components | Mix components A and C, leave mixture for one week and mix whole components |
| | Refractive index of particles | | 1.43 | 1.43 | — | — |
| | Refractive index of region other than particles and phosphor | | 1.41 | 1.41 | 1.53 | 1.41 |
| | Difference in refractive index | | 0.02 | 0.02 | — | — |
| | Precipitation inhibition 1 | | 10 hr | 4 hr | <1 hr | <1 hr |
| | Absolute viscosity (Pa · S) | | 1.8 | 1.73 | 2.75 | 1.68 |
| | Yield value (Pa) | | 0.042 | 0.011 | None | None |
| | Transmittance | | 97% | 97% | 97% | 98% |

TABLE 5

| | | | Example 26 | Example 27 | Example 28 | Example 29 | Example 30 |
|---|---|---|---|---|---|---|---|
| Composition | A: vinyl silicone | Kind | Composition 2 | Composition 2 | Composition 2 | Composition 2 | Composition 2 |
| | | Amount (part by weight) | | | | | |
| | B: SiH silicone | Kind | | | | | |
| | | Amount (part by weight) | | | | | |
| | C: Catalyst | Kind | | | | | |
| | | Amount (part by weight) | | | | | |

TABLE 5-continued

|  |  | Example 26 | Example 27 | Example 28 | Example 29 | Example 30 |
|---|---|---|---|---|---|---|
| D: Phosphor | Kind | Phosphor 1 | Phosphor 1 | Phosphor 1 | Phosphor 1 | Phosphor 1 |
|  | Amount (part by weight) | 10 | 10 | 10 | 10 | 10 |
| E: Particles | Kind | Particles 8 | Particles 9 | Particles 10 | Particles 11 | Particles 10 |
|  | Amount (part by weight) | 10 | 10 | 10 | 10 | 3 |
| Refractive index of particles |  | 1.41 | 1.41 | 1.42 | 1.42 | 1.42 |
| Refractive index of region other than particles and phosphor |  | 1.41 | 1.41 | 1.41 | 1.41 | 1.41 |
| Difference in refractive index |  | 0 | 0 | 0.01 | 0.01 | 0.01 |
| Precipitation inhibition 1 |  | 10 hr | 10 hr | 10 hr | 7 hr | 5 hr |
| Absolute viscosity (Pa·S) |  | 2.05 | 2.01 | 2.2 | 1.98 | 1.8 |
| Yield value (Pa) |  | 0.23 | 0.22 | 0.22 | 0.15 | 0.05 |
| Transmittance |  | 98% | 97% | 97% | 96% | 98% |
| Note |  |  |  |  | Poorly cured | Poorly cured |

TABLE 6

|  |  |  | Example 31 | Example 32 | Example 33 | Example 34 |
|---|---|---|---|---|---|---|
| Composition | A: vinyl silicone | Kind | Composition 2 | Composition 2 | Composition 2 | Composition 2 |
|  |  | Amount (part by weight) |  |  |  |  |
|  | B: SiH silicone | Kind |  |  |  |  |
|  |  | Amount (part by weight) |  |  |  |  |
|  | C: Catalyst | Kind |  |  |  |  |
|  |  | Amount (part by weight) |  |  |  |  |
|  | D: Phosphor | Kind | Phosphor 1 | Phosphor 1 | Phosphor 1 | Phosphor 1 |
|  |  | Amount (part by weight) | 5 | 5 | 5 | 5 |
|  | E: Particles | Kind | Particles 12 | Particles 13 | Particles 14 | Particles 15 |
|  |  | Amount (part by weight) | 7.5 | 7.5 | 5 | 3 |
| Refractive index of particles |  |  | 1.53 | 1.56 | 1.56 | 1.56 |
| Refractive index of region other than particles and phosphor |  |  | 1.54 | 1.54 | 1.54 | 1.54 |
| Difference in refractive index |  |  | 0.01 | 0.02 | 0.02 | 0.02 |
| Precipitation inhibition 1 |  |  | 10 hr | 10 hr | 10 hr | 10 hr |
| Absolute viscosity (Pa·S) |  |  | 2.05 | 2.06 | 2.2 | 2.1 |
| Yield value (Pa) |  |  | 0.23 | 0.23 | 0.27 | 0.3 |
| Transmittance |  |  | 98% | 97% | 98% | 99% |
| Temperature dependency of transmittance | Transmittance (25° C.) |  | 44% | 45% | 44% | 44% |
|  | Transmittance (60° C.) |  | 36% | 43% | 43% | 44% |
|  | Ratio of transmittance |  | 0.83 | 0.96 | 0.98 | 1 |

TABLE 7

|  |  |  | Example 35 | Example 36 | Example 37 | Example 38 | Example 39 | Example 40 | Example 41 |
|---|---|---|---|---|---|---|---|---|---|
| Composition | A: vinyl silicone | kind | Compound A1 | Compound A1 | Compound A1 | Compound A1 | Compound A1 | Compound A1 | Compound A1 |
|  |  | Amount (part by weight) | 70 | 70 | 70 | 70 | 70 | 70 | 70 |
|  | B: SiH silicone | kind | Compound B1 | Compound B1 | Compound B1 | Compound B1 | Compound B1 | Compound B1 | Compound B1 |
|  |  | Amount (part by weight) | 10 | 10 | 10 | 10 | 10 | 10 | 10 |
|  | C: | kind | Catalyst 1 | Catalyst 1 | Catalyst 1 | Catalyst 1 | Catalyst 1 | Catalyst 1 | Catalyst 1 |

TABLE 7-continued

| | | | | | | | | | |
|---|---|---|---|---|---|---|---|---|---|
| Catalyst | Amount (part by weight) | | 0.01 | 0.01 | 0.01 | 0.01 | 0.01 | 0.01 | 0.01 |
| D: Phosphor | kind | | Phosphor 1 | Phosphor 1 | Phosphor 1 | Phosphor 1 | Phosphor 1 | Phosphor 1 | Phosphor 1 |
| | Amount (part by weight) | | 10 | 10 | 10 | 10 | 10 | 10 | 10 |
| E: Particles | kind | | Particles 2 | Particles 2 | Particles 2 | Particles 2 | Particles 5 | Particles 3 | Particles 1 |
| | Amount (part by weight) | | 10 | 10 | 4 | 25 | 10 | 10 | 10 |
| Refractive index of particles | | | 1.54 | 1.54 | 1.54 | 1.54 | 1.52 | 1.52 | 1.43 |
| Refractive index of region other than particles and phosphor | | | 1.53 | 1.53 | 1.53 | 1.53 | 1.53 | 1.53 | 1.53 |
| Difference in refractive index | | | 0.01 | 0.01 | 0.01 | 0.01 | 0.01 | 0.01 | 0.1 |
| Absolute viscosity (Pa·S) | | | 4.73 | 4.73 | 3.54 | 5.01 | 4.65 | 4.84 | 3.62 |
| Yield value (Pa) | | | 0.325 | 0.325 | 0.042 | 0.35 | 0.301 | 0.342 | 0.044 |
| Production method | Binning of light-emitting element | | Yes | Yes | Yes | Yes | Yes | Yes | Yes |
| | Binning of LED module after sealing of phosphor-containing resin | | None | None | None | None | None | None | None |
| | Processing type | | Single-type processing | Roll to Roll processing | Single-type processing | Single-type processing | Single-type processing | Single-type processing | Single-type processing. |
| Test pass rate | | | 99% | 99% | 99% | 99% | 99% | 99% | 97% |
| Processing rate | | | ○ | ◎ | ○ | ○ | ○ | ○ | ○ |

| | | | Example 42 | Example 43 | Example 44 | Example 45 | Comparative Example 11 | Comparative Example 12 |
|---|---|---|---|---|---|---|---|---|
| Composition | A: vinyl silicone | kind | Compound A1 | Compound A1 | Compound A2 | Compound A3 | Compound A1 | Compound A1 |
| | | Amount (part by weight) | 70 | 70 | 70 | 70 | 70 | 70 |
| | B: SiH silicone | kind | Compound B1 | Compound B1 | Compound B2 | Compound B3 | Compound B1 | Compound B1 |
| | | Amount (part by weight) | 10 | 10 | 10 | 10 | 10 | 10 |
| | C: Catalyst | kind | Catalyst 1 | Catalyst 1 | Catalyst 1 | Catalyst 2 | Catalyst 1 | Catalyst 1 |
| | | Amount (part by weight) | 0.01 | 0.01 | 0.01 | 0.01 | 0.01 | 0.01 |
| | D: Phosphor | kind | Phosphor 1 | Phosphor 2 | Phosphor 1 | Phosphor 1 | Phosphor 1 | Phosphor 1 |
| | | Amount (part by weight) | 10 | 10 | 10 | 10 | 10 | 10 |
| | E: Particles | kind | Particles 4 | Particles 2 | Particles 2 | Particles 1 | None | None |
| | | Amount (part by weight) | 10 | 10 | 10 | 10 | None | None |
| | Refractive index of particles | | 1.56 | 1.54 | 1.54 | 1.43 | — | — |
| | Refractive index of region other than particles and phosphor | | 1.53 | 1.53 | 1.47 | 1.41 | 1.53 | 1.53 |
| | Difference in refractive index | | 0.03 | 0.01 | 0.07 | 0.02 | — | — |
| | Absolute viscosity (Pa·S) | | 4.79 | 4.74 | 4.68 | 1.79 | 2.75 | 2.75 |
| | Yield value (Pa) | | 0.343 | 0.338 | 0.301 | 0.041 | None | None |
| Production method | Binning of light-emitting element | | Yes | Yes | Yes | Yes | Yes | Yes |
| | Binning of LED module after sealing of phosphor-containing resin | | None | None | None | None | Yes | None |
| | Processing type | | Single-type processing | Single-type processing | Single-type processing | Single-type processing | Single-type processing | Single-type processing |
| Test pass rate | | | 99% | 99% | 98% | 99% | 99% | 0% |
| Processing rate | | | ○ | ○ | ○ | ○ | X | ○ |

Processing rate: ◎ Very fast, ○ Fast, X Slow

Industrial Applicability

According to the present invention, it is possible to manufacture a cured silicone in which a phosphor is uniformly dispersed by a convenient method using an inexpensive raw material, while keeping characteristics of a silicone material that it has good thermal resistance and lightfastness. Also, according to the present invention, since it is possible to reduce a chromaticity deviation of an LED-mounted substrate, it is unnecessary to classify LED modules according to their optical characteristics, and it is possible to drastically reduce the production cost of an LED light-emitting member when such an LED-mounted substrate is used as an LED module.

DESCRIPTION OF REFERENCE SIGNS

1: LED element
2: circuit pattern containing predetermined repeating unit
3: adhesive layer
4: heat dissipation layer
5: white solder resist
6: bonding wire
7: reflection plate
8: phosphor-containing silicone composition

The invention claimed is:

1. A phosphor-containing cured silicone that is a cured silicone which has a structure represented by general formulae (1) and/or (2) and also has units selected from general formulae (3) and/or (4), the phosphor-containing cured silicone includes a phosphor and particles having units selected from general formulae (3) and/or (4):

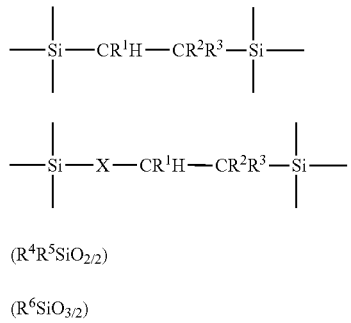

wherein $R^1$ to $R^3$ are each a hydrogen atom, a methyl group, an ethyl group or a propyl group; X represents a methylene group, a dimethylene group or a trimethylene group, and may be the same or different; and $R^4$ to $R^6$ are each a substituted or unsubstituted monovalent hydrocarbon group, and may be the same or different, wherein the particles are produced in the presence of polymeric dispersing agent, and wherein the polymeric dispersing agent is a water-soluble polymer.

2. The phosphor-containing cured silicone according to claim 1, wherein the particles have a homogeneous structure.

3. The phosphor-containing cured silicone according to claim 1, wherein a ratio between the transmittance at 25° C. and the transmittance at 60° C. at a wavelength of 450 nm is 0.8 or more when the phosphor-containing cured silicone has a thickness of 75 μm.

4. The phosphor-containing cured silicone according to claim 1, wherein a ratio between the transmittance at 25° C. and the transmittance at 60° C. at a wavelength of 450 nm is 0.8 or more when a cured silicone obtained by curing the particles and the following components (A) to (C) has a thickness of 75 μm:

Component (A): a compound having units selected from general formulae (5) and/or (6) and containing two or more alkenyl groups bound to a silicon atom and/or silicon atoms in one molecule;
Component (B): a compound having units selected from general formulae (5) and/or (6) and containing two or more hydrogen atoms bound to a silicon atom and/or silicon atoms in one molecule; and
Component (C): a hydrosilylation catalyst:

$$(R^7R^8SiO_{2/2}) \quad (5)$$

$$(R^9SiO_{3/2}) \quad (6)$$

wherein $R^7$ to $R^9$ are each a substituted or unsubstituted monovalent hydrocarbon group, and may be the same or different.

5. The phosphor-containing cured silicone according to claim 1, wherein a difference between a refractive index $d_1$ of the particles and a refractive index $d_2$ of a region other than the particles and the phosphor is less than 0.03.

6. The phosphor-containing cured silicone according to claim 1, wherein a difference between a refractive index $d_1$ of the particles and a refractive index $d_3$ of a cured product obtained by curing the following components (A) to (C) is less than 0.03:

Component (A): a compound having units selected from general formulae (5) and/or (6) and containing two or more alkenyl groups bound to a silicon atom and/or silicon atoms in one molecule;
Component (B): a compound having units selected from general formulae (5) and/or (6) and containing two or more hydrogen atoms bound to a silicon atom and/or silicon atoms in one molecule; and
Component (C): a hydrosilylation catalyst:

$$(R^7R^8SiO_{2/2}) \quad (5)$$

$$(R^9SiO_{3/2}) \quad (6)$$

wherein $R^7$ to $R^9$ are each a substituted or unsubstituted monovalent hydrocarbon group, and may be the same or different.

7. The phosphor-containing cured silicone according to claim 1, wherein the particles have an average particle diameter of 0.01 μm to 10 μm.

8. A phosphor-containing silicone composition that is a silicone composition for production of the phosphor-containing cured silicone defined in claim 1, the phosphor-containing silicone composition is produced by mixing the following components (A) to (E):

Component (A): a compound having units selected from general formulae (5) and/or (6) and containing two or more alkenyl groups bound to a silicon atom and/or silicon atoms in one molecule;
Component (B): a compound having units selected from general formulae (5) and/or (6) and containing two or more hydrogen atoms bound to a silicon atom and/or silicon atoms in one molecule;
Component (C): a hydrosilylation catalyst;
Component (D): a phosphor; and
Component (E): particles having units selected from general formulae (5) and/or (6),:

$$(R^7R^8SiO_{2/2}) \quad (5)$$

$$(R^9SiO_{3/2})tm \quad (6)$$

wherein $R^7$ to $R^9$ are each a substituted or unsubstituted monovalent hydrocarbon group, and may be the same or different, wherein the particles are produced in the presence of a polymeric dispersing agent, and wherein the polymeric disoersing agent is a water-soluble polymer.

9. The phosphor-containing silicone composition according to claim 8, which has a yield value of 0.01 Pa or more.

10. A silicone composition precursor for production of the phosphor-containing silicone composition defined in claim 8, the silicone composition precursor being produced by mixing at least two of the following components (A) to (E), and having one composition selected from the group consisting of the following compositions (i) to (vii):
   Component (A): a compound having units selected from general formulae (5) and/or (6) and containing two or more alkenyl groups bound to a silicon atom and/or silicon atoms in one molecule;
   Component (B): a compound having units selected from general formulae (5) and/or (6) and containing two or more hydrogen atoms bound to a silicon atom and/or silicon atoms in one molecule;
   Component (C): a hydrosilylation catalyst;
   Component (D): a phosphor; and
   Component (E): particles having units selected from general formulae (5) and/or (6), wherein the particles are produced in the presence of a polymeric dispersing agent, and wherein the polymeric dispersing agent is a water-soluble polymer:

$$(R^7R^8SiO_{2/2}) \quad (5)$$

$$(R^9SiO_33/2_2) \quad (6)$$

wherein $R^7$ to $R^9$ are each a substituted or unsubstituted monovalent hydrocarbon group, and may be the same or different, and
   (i) Components (A) and (B);
   (ii) Components (A) and (C);
   (iii) Components (A) and (E);
   (iv) Components (A), (C) and (E);
   (v) Components (B) and (E);
   (vi) Components (A), (B) and (E); and
   (vii) Components (C) and (E).

11. A process for production of an LED-mounted substrate by mounting an LED element on a substrate having a circuit pattern formed therein, the process comprising:
   bonding a plurality of LED elements to a substrate having a circuit pattern formed on at least one surface thereof; and then
   collectively sealing the plurality of LED elements with the phosphor-containing silicone composition defined in claim 8.

12. The process according to claim 11, comprising installing a reflection plate on the LED elements.

13. The phosphor-containing silicone composition according to claim 8, wherein the polymeric dispersing agent is in a range of $5 \times 10^{-7}$ to 0.05 parts by weight, based on 1 part by weight of a reaction solution for producing the particles.

14. A process for production of the phosphor-containing cured silicone defined in claim 1 by mixing the following components (A) to (E), the process comprising:
   producing a phosphor-containing silicone composition through any one of the following operations (I) to (VIII); and
   curing the phosphor-containing silicone composition:
   Component (A): a compound having units selected from general formulae (5) and/or (6) and containing two or more alkenyl groups bound to a silicon atom and/or silicon atoms in one molecule;
   Component (B): a compound having units selected from general formulae (5) and/or (6) and containing two or more hydrogen atoms bound to a silicon atom and/or silicon atoms in one molecule;
   Component (C): a hydrosilylation catalyst;
   Component (D): a phosphor; and
   Component (E): particles having units selected from general formulae (5) and/or (6), wherein the particles are produced in the presence of a polymeric dispersing agent, and wherein the polymeric dispersing agent is a water-soluble polymer:

$$(R^7R^8SiO_{2/2}) \quad (5)$$

$$(R^9SiO_{3/2}) \quad (6)$$

wherein $R^7$ to $R^9$ are each a substituted or unsubstituted monovalent hydrocarbon group, and may be the same or different, and
   (I) mixing a composition precursor including the components (A), (C) and (E) with the component (B);
   (II) mixing a composition precursor including the components (A) and (C) with a composition precursor including the components (B) and (E);
   (III) mixing a composition precursor including the components (A), (C) and (E) with a composition precursor including the components (B) and (E);
   (IV) mixing a composition precursor including the components (A) and (C) with a composition precursor including the components (A) and (B) together with the component (E);
   (V) mixing a composition precursor including the components (A) and (C) with the components (A), (B) and (E);
   (VI) mixing a composition precursor including the component (B) with the component (D);
   (VII) mixing a composition precursor including the component (C) with the component (D); and
   (VIII) mixing a composition precursor including the component (B) with a composition precursor including the component (C), followed by or at substantially the same time mixing with the component (D).

15. A process for production of the phosphor-containing cured silicone defined in claim 1 by mixing the following components (A) to (E), the process comprising:
   producing a phosphor-containing silicone composition through any one of the following operations (IX) to (XI); and
   curing the phosphor-containing silicone composition:
   Component (A): a compound having units selected from general formulae (5) and/or (6) and containing two or more alkenyl groups bound to a silicon atom and/or silicon atoms in one molecule;
   Component (B): a compound having units selected from general formulae (5) and/or (6) and containing two or more hydrogen atoms bound to a silicon atom and/or silicon atoms in one molecule;
   Component (C): a hydrosilylation catalyst;
   Component (D): a phosphor; and
   Component (E): particles having units selected from general formulae (5) and/or (6), wherein the particles are produced in the presence of a polymeric dispersing agent, and wherein the polymeric dispersing agent is a water-soluble polymer:

$$(R^7R^8SiO_{2/2}) \quad (5)$$

$$(R^9SiO_{3/2}) \quad (6)$$

wherein $R^7$ to $R^9$ are each a substituted or unsubstituted monovalent hydrocarbon group, and may be the same or different, and (IX) mixing the component (B) with the component (D);

(X) mixing the component (C) with the component (D); and (XI) mixing the component (B) with the component (C), followed by or at substantially the same time mixing with the component (D).

16. A sheet in which the phosphor-containing cured silicone defined in claim 1 is molded on a substrate.

17. An LED package comprising the phosphor-containing cured silicone defined in claim 1.

18. A light-emitting device comprising the LED package defined in claim 17.

19. The phosphor-containing cured silicone according to claim 1, wherein the polymeric dispersing agent is in a range of $5 \times 10^{-7}$ to 0.05 parts by weight, based on 1 part by weight of a reaction solution for producing the particles.

* * * * *